US012218007B2

(12) United States Patent
Su et al.

(10) Patent No.: US 12,218,007 B2
(45) Date of Patent: Feb. 4, 2025

(54) SELF-ALIGNED VIA FORMATION USING SPACERS

(71) Applicant: Taiwan Semiconductor Manufacturing Co., Ltd., Hsinchu (TW)

(72) Inventors: Yi-Nien Su, Hsinchu (TW); Jyu-Horng Shieh, Hsinchu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 542 days.

(21) Appl. No.: 17/340,629

(22) Filed: Jun. 7, 2021

(65) Prior Publication Data

US 2022/0102212 A1    Mar. 31, 2022

Related U.S. Application Data

(60) Provisional application No. 63/085,209, filed on Sep. 30, 2020.

(51) Int. Cl.
| H01L 21/76 | (2006.01) |
| H01L 21/311 | (2006.01) |
| H01L 21/768 | (2006.01) |

(52) U.S. Cl.
CPC .. *H01L 21/76897* (2013.01); *H01L 21/31144* (2013.01); *H01L 21/76808* (2013.01); *H01L 21/76816* (2013.01); *H01L 21/7684* (2013.01); *H01L 21/76877* (2013.01)

(58) Field of Classification Search
None
See application file for complete search history.

(56) References Cited

U.S. PATENT DOCUMENTS

| 10,256,140 | B2 | 4/2019 | Mohanty |
| 10,867,804 | B2 | 12/2020 | Su |
| 11,094,422 | B2 | 8/2021 | Horn et al. |
| 11,378,882 | B2 | 7/2022 | Chen et al. |
| 2018/0025943 | A1 | 1/2018 | Burns et al. |
| 2018/0151363 | A1 | 5/2018 | Su |
| 2018/0166330 | A1* | 6/2018 | Chu ................ H01L 21/31144 |
| 2018/0261457 | A1 | 9/2018 | Law et al. |
| 2018/0308749 | A1 | 10/2018 | Yang et al. |
| 2019/0064658 | A1* | 2/2019 | Chen ................ H01L 21/31111 |
| 2020/0035492 | A1 | 1/2020 | Feng et al. |

FOREIGN PATENT DOCUMENTS

| JP | 2019537254 A | 12/2019 |
| KR | 20160044453 A | 4/2016 |
| KR | 20190024533 A | 3/2019 |
| KR | 20190038421 A | 4/2019 |
| TW | 202002076 A | 1/2020 |

* cited by examiner

*Primary Examiner* — Bradley Smith
(74) *Attorney, Agent, or Firm* — Slater Matsil, LLP

(57) ABSTRACT

A method includes forming a first mandrel and a second mandrel over a dielectric layer, and forming a first spacer and a second spacer on the first mandrel and the second mandrel, respectively. The first spacer and the second spacer are next to each other with a space in between. The dielectric layer is etched to form an opening in the dielectric layer, with the opening being overlapped by the space, and with the first spacer and the second spacer being used as a part of an etching mask in the etching. A conductive material is filled into the opening. A planarization process is performed on the conductive material.

20 Claims, 27 Drawing Sheets

SELF-ALIGNED VIA FORMATION USING SPACERS

PRIORITY CLAIM AND CROSS-REFERENCE

This application claims the benefit of the following provisionally filed U.S. Patent application: Application No. 63/085,209, filed Sep. 30, 2020, and entitled "Spacer Self Align Via Approach;" which application is hereby incorporated herein by reference.

BACKGROUND

Metal lines and vias are used for interconnecting integrated circuits such as transistors to form functional circuits. With the reduction of the sizes of devices, metal lines and vias are also becoming smaller. The formation of the metal lines and vias may need to form metal hard mask layer for defining the sizes and the positions of the metal lines and/or vias. The metal hard mask layer, however, may be damaged sometimes, causing defects in metal lines and/or vias.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
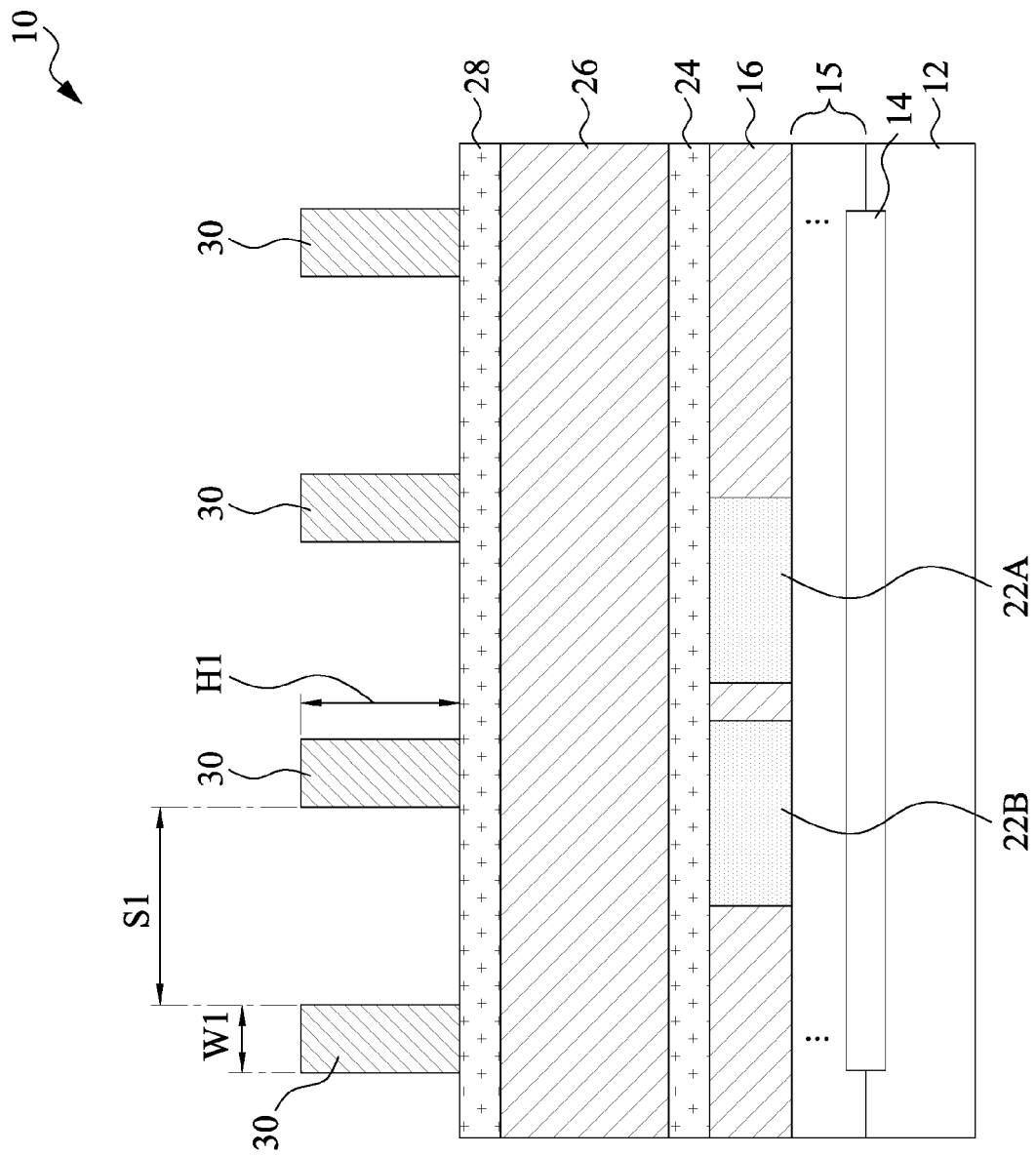
FIGS. 1-3, 4A, 4B, 5A, 5B, 6A, 6B, 7A, 7B, 7C, 8-18, 19A, 19B, and 20 illustrate the cross-sectional views and top views of intermediate stages in the formation of an interconnect structure including metal lines and vias in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An interconnect structure including metal lines and vias and the method of forming the same are provided. In accordance with some embodiments of the present disclosure, mandrels are formed, and spacers are formed on the sidewalls of the mandrels. The spaces between the spacers may be used in a first patterning process (of a double patterning process) for forming first metal lines and vias. In addition, the spaces occupied by the mandrels may be used in a second patterning process of the double patterning process for forming second metal lines and vias. The spacers, which are used as parts of etching masks in the double patterning processes, may be formed tall without increasing the lateral dimensions, and hence are effective to be used as etching masks. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

FIGS. 1-3, 4A, 4B, 5A, 5B, 6A, 6B, 7A, 7B, 7C, 8-18, 19A, 19B, and 20 illustrate the cross-sectional views of intermediate stages in the formation of an interconnect structure in accordance with some embodiments of the present disclosure. The corresponding processes are also reflected schematically in the process flow 200 as shown in FIG. 21.

FIG. 1 illustrates a cross-sectional view of wafer 10, wherein the illustrated portion is a part of a device die in wafer 10. In accordance with some embodiments of the present disclosure, wafer 10 is a device wafer including active devices such as transistors and/or diodes, and possibly passive devices such as capacitors, inductors, resistors, and/or the like.

In accordance with some embodiments of the present disclosure, wafer 10 includes semiconductor substrate 12 and the features formed at a top surface of semiconductor substrate 12. Semiconductor substrate 12 may be formed of crystalline semiconductor material such as silicon, germanium, silicon germanium, and/or a III-V compound semiconductor such as GaAsP, AlIAs, AlGaAs, GaInAs, GaInP, GaInAsP, or the like. Semiconductor substrate 12 may also be a bulk silicon substrate or a Silicon-On-Insulator (SOI) substrate. Shallow Trench Isolation (STI) regions (not shown) may be formed in semiconductor substrate 12 to isolate the active regions in semiconductor substrate 12. Although not shown, through-vias may be formed to extend into semiconductor substrate 12, wherein the through-vias are used to electrically inter-couple the features on opposite sides of semiconductor substrate 12. Active devices 14, which may include transistors, are formed at the top surface of semiconductor substrate 12.

Further illustrated in FIG. 1 is dielectric layer 16. In accordance with some embodiments of the present disclosure, dielectric layer 16 is formed of a low-k dielectric material having a dielectric constant (k-value) lower than about 3.5, lower than about 3.0, or even lower. Dielectric layer 16 may be formed of Black Diamond (a registered trademark of Applied Materials), a carbon-containing low-k dielectric material, Hydrogen SilsesQuioxane (HSQ), MethylSilsesQuioxane (MSQ), or the like. In accordance with some embodiments of the present disclosure, the formation of dielectric layer 16 includes depositing a porogen-containing dielectric material and then performing a curing process to drive out the porogen, and hence the remaining dielectric layer 16 is porous.

Conductive features 22A and 22B are formed in dielectric layer 16. In accordance with some embodiments, each of conductive features 22A and 22B includes a diffusion barrier layer and a copper-containing material over the diffusion barrier layer. The diffusion barrier layer may be formed of titanium, titanium nitride, tantalum, tantalum nitride, or the like, and has the function of preventing copper in copper-containing material from diffusing into IMD 16. Alternatively, conductive features 22A and 22B may be barrier-less, and may be formed of cobalt, tungsten, or the like. Conductive features 22A and 22B may have a single damascene structure or a dual damascene structure.

In accordance with some embodiment, dielectric layer 16 is an Inter-Metal Dielectric (IMD) layer, and conductive features 22A and 22B are metal lines and/or vias. In accordance with alternative embodiments, dielectric layer 16 is an inter-layer dielectric layer, and conductive features 22A and 22B are contact plugs. There may be, or may not be, additional features between dielectric layer 16 and devices 14, and the additional features are represented as structure 15, which may include dielectric layers such as a contact etch stop layer, an inter-layer dielectric, etch stop layers, and IMDs. Structure 15 may also include contact plugs, vias, metal lines, etc.

Dielectric layer 24 is deposited over dielectric layer 16 and conductive lines 22A and 22B. Dielectric layer 24 may be used as an Etch Stop Layer (ESL), and hence is referred to as etch stop layer or ESL 24 throughout the description. Etch stop layer 24 may include a nitride, a silicon-carbon based material, a carbon-doped oxide, or a metal-containing dielectric such as SiCN, SiOCN, SiOC, $AlO_x$, AlN, AlCN, or the like, or combinations thereof. Etch stop layer 24 may be a single layer formed of a homogeneous material, or a composite layer including a plurality of dielectric sub-layers. In accordance with some embodiments of the present disclosure, etch stop layer 24 includes an aluminum nitride (AlN) layer, a SiOC layer over the AlN layer, and an aluminum oxide ($AlO_x$) layer over the SiOC layer.

Dielectric layer 26 is deposited over ESL 24. In accordance with some exemplary embodiments of the present disclosure, dielectric layer 26 is formed of a silicon-containing dielectric material such as silicon oxide. Dielectric layer 26 may also be formed of a low-k dielectric material, and hence is referred to as low-k dielectric layer 26 hereinafter. Low-k dielectric layer 26 may be formed using a material selected from the same group of candidate materials for forming dielectric layer 16. When selected from the same group of candidate materials, the materials of dielectric layers 16 and 26 may be the same or different from each other.

Mask layer 28 is formed over dielectric layer 26. In accordance with some embodiments of the present disclosure, mask layer 28 is a single-layer mask, which may be formed of or comprises silicon oxide, silicon nitride, a metal-containing oxide such as titanium oxide, or a metal-containing nitride such as titanium nitride. Alternatively, mask layer 28 has a composite structure including a plurality of sub layers, which may be formed of the aforementioned materials. Mask layer 28 may be formed using Plasma Enhanced Chemical Vapor Deposition (PECVD), Atomic Layer Deposition (ALD), Chemical Vapor Deposition (CVD), or the like A plurality of mandrels 30 are formed over mask layer 28. The respective process is illustrated as process 202 in the process flow 200 as shown in FIG. 21. In accordance with some embodiments, mandrels 30 are formed as a plurality of parallel strips, for example, as shown in the top view shown in FIG. 4B. Mandrels 30 may be formed of or comprise amorphous silicon, amorphous carbon, tin oxide, or the like. In accordance with some embodiments, the widths W1 of mandrels 30 are in the range between about 5 nm and about 20 nm. Spacing S1 between neighboring mandrels 30 may be about 2.5 times to about 4 times width W1. The height H1 of mandrels 30 may be in the range between about 10 nm and about 40 nm, and may be in the range between about 25 nm and about 40 nm in accordance with some embodiments. The formation of mandrels 30 may include depositing a blanket layer, which may be a planar layer having a uniform thickness, and then performing an etching process to pattern the blanket layer and to form mandrels 30.

Figure 2:
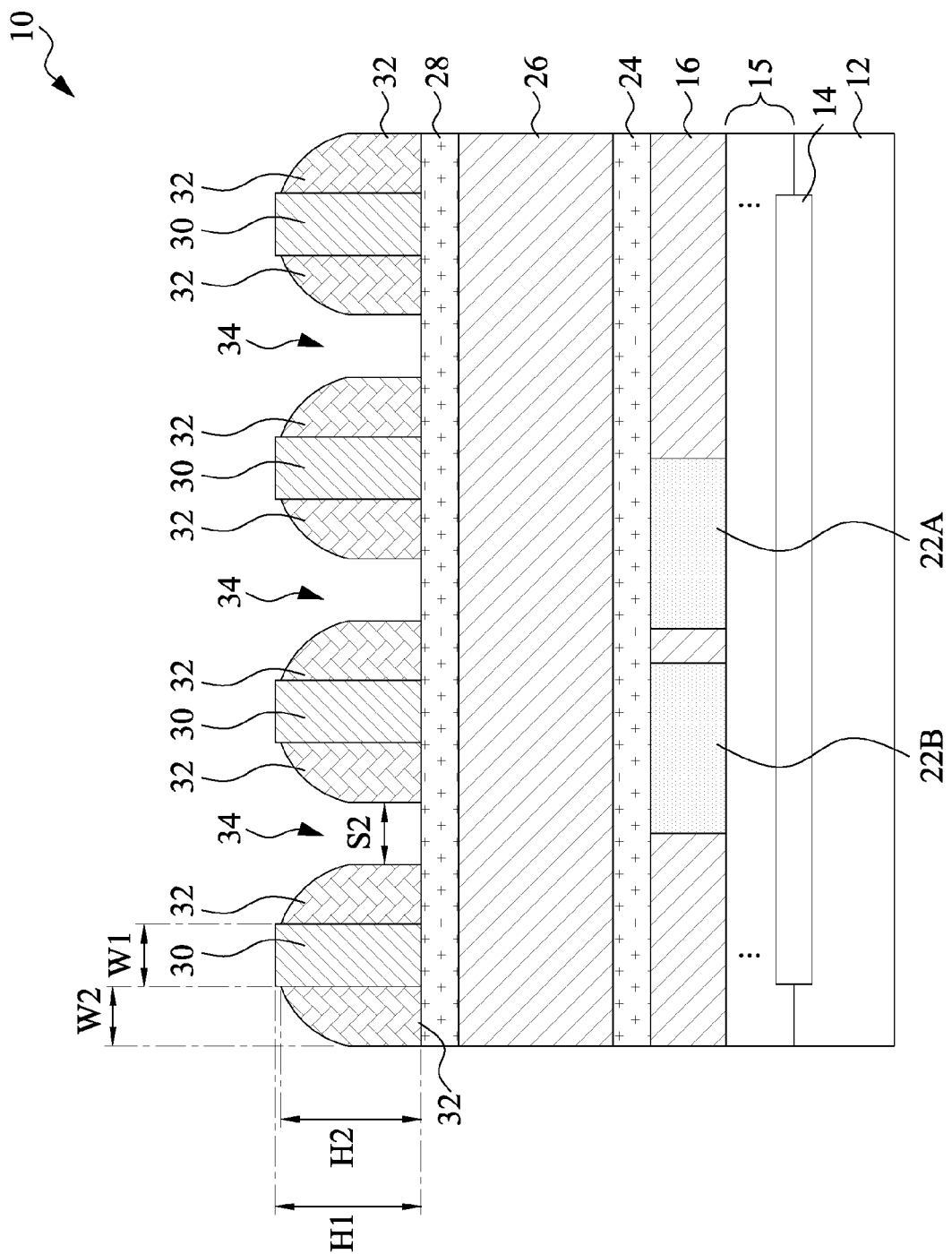

Referring to FIG. 2, spacers 32 are formed. The respective process is illustrated as process 204 in the process flow 200 as shown in FIG. 21. In accordance with some embodiments, spacers 32 are formed of or comprise a metal-containing material such as a metal oxide or a metal nitride, for example, titanium oxide, titanium nitride, or the like. The widths W2 of spacers 32 may be in the range between about 5 nm and about 20 nm. The height H2 of spacers 32 is equal to or slightly smaller than (for example, between about 80 percent and 100 percent) the height H1 of mandrels 30. Height H2 may be in the range between about 20 nm and about 40 nm, and may be in the range between about 25 nm and about 40 nm. Height H2 is further greater than width W2 of spacers 32, and may be greater than about 1.5 times or two times width W2. The formation process of spacers 32 may include performing a conformal deposition process to form a conformal spacer layer, which includes vertical portions on the sidewalls of mandrels 30, top horizontal portions on top of mandrels 30, and bottom horizontal portions between the vertical portions. An anisotropic etching process is then performed to remove the top horizontal portions and the bottom horizontal portions, and leaving the vertical portions, which are spacers 32. In accordance with some embodiments, the anisotropic etching process is performed using etching gases such as $Cl_2$, HBr, $CH_4$, or the like, or combinations thereof. Carrier gases such as $N_2$, argon, or the like, may also be added into the etching gases. The spacers 32 formed on the neighboring mandrels 30 have spaces 34 in between, which may have spacings S2 in the range between about 0.5W1 and about 1.5W2.

Figure 3:
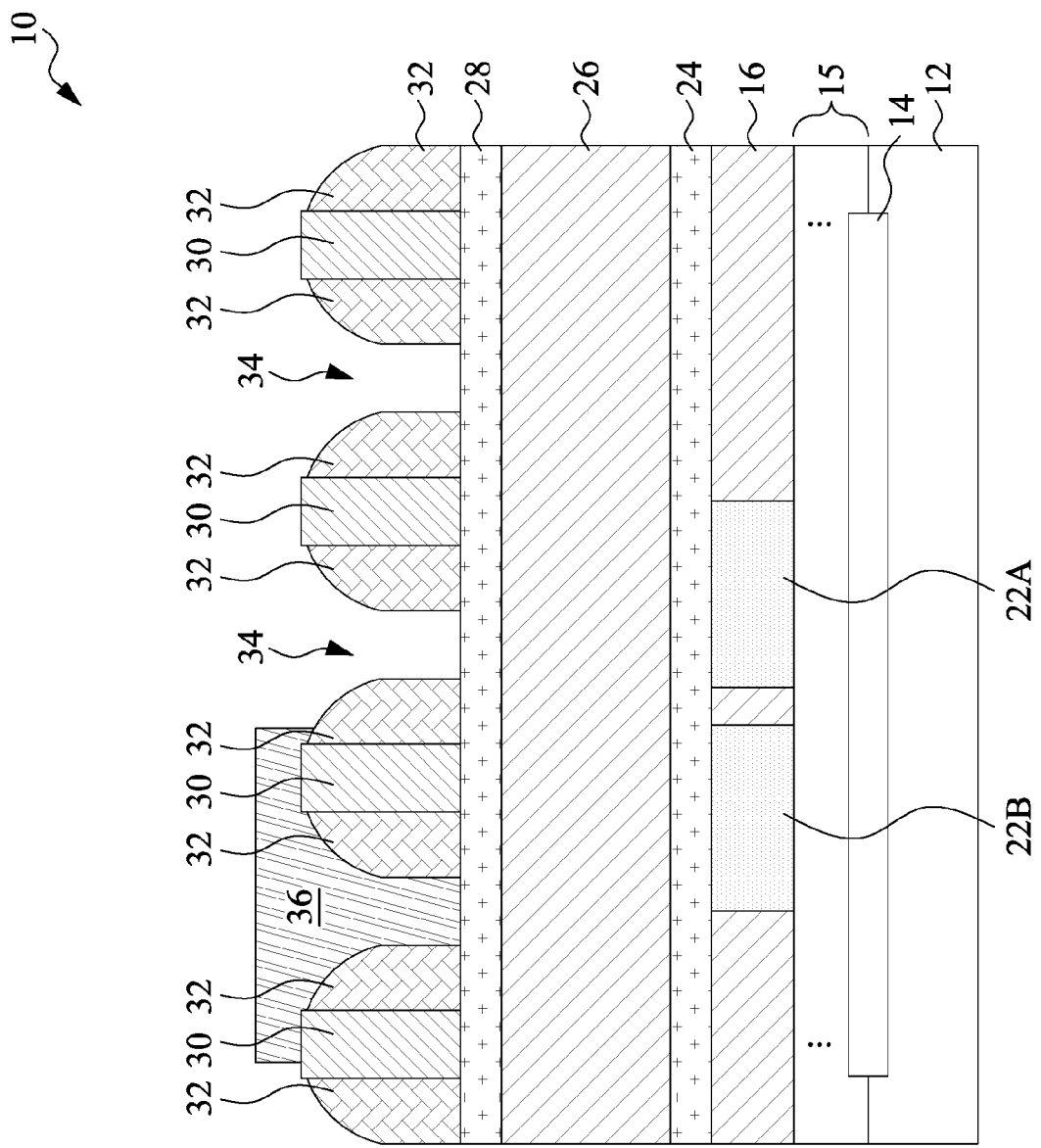

FIGS. 3, 4A, 4B, 5A, 5B, 6A, 6B, 7A, 7B, 7C, and 8-10 illustrate the formation of first vias and metal lines in dielectric layer 26 in accordance with some embodiments. The respective processes may also be referred to as a first patterning process in a double-patterning process. FIG. 3 illustrates the formation of protection layer 36. The respective process is illustrated as process 206 in the process flow 200 as shown in FIG. 21. In accordance with some embodiments, protection layer 36 is formed of a material that is not etched in the subsequent etching of dielectric layer 26. Furthermore, protection layer 36 is formed of a material that is different from the materials of both of mandrels 30 and spacers 32, so that in the patterning of protection layer 36, mandrels 30 and spacers 32 are not damaged. In accordance with some embodiments, protection layer 36 may be (or may not be) formed of a material selected from the same group of candidate materials for forming spacers 32. In accordance with some embodiments, protection layer 36 is formed of or comprises titanium oxide, titanium nitride, silicon oxide, or the like. The formation of protection layer 36 includes depositing a blanket layer, and then performing an etching process to pattern and remove the undesirable portions of the protection layer 36. The etching process may be performed using gases including $O_2$, $CO_2$, $NH_3$, and/or the like. The lithography process in the patterning may be performed using an Extreme Ultra Violet (EUV) light, for example, with 193 nm wavelength.

Figure 4A:
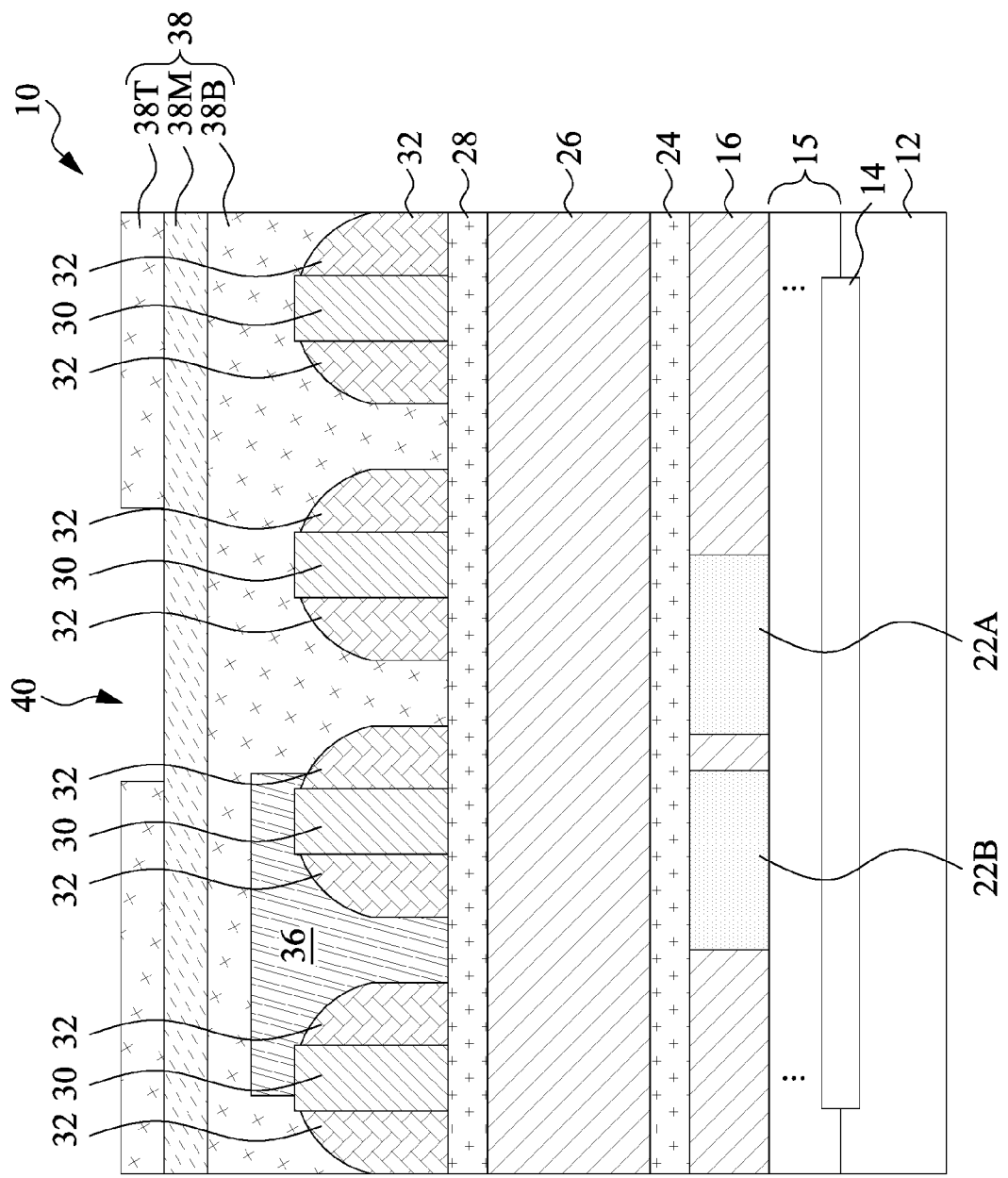

Referring to FIG. 4A, an etching mask 38, which may be a tri-layer, is formed. The respective process is illustrated as process 208 in the process flow 200 as shown in FIG. 21. Etching mask 38 may include bottom layer (also sometimes referred to as an under layer) 38BL, middle layer 38ML over bottom layer 38BL, and top layer (also sometimes referred to as an upper layer) 38TL over middle layer 38ML. In accordance with some embodiments, bottom layer 38BL and top layer 38TL are formed of photo resists, with the bottom layer 38BL being cross-linked already. Middle layer 38ML may be formed of an inorganic material, which may be a nitride (such as silicon nitride), an oxynitride (such as silicon oxynitride), an oxide (such as silicon oxide), or the like. Middle layer 38ML has a high etching selectivity with relative to top layer 38TL and bottom layer 38BL, and hence top layer 38TL may be used as an etching mask for patterning middle layer 38ML, and middle layer 38ML may be used as an etching mask for patterning bottom layer 38BL. Top layer 38TL is patterned to form opening 40, which is used to define a via opening in low-k dielectric layer 26. The lithography process in the patterning may be performed using an EUV light, for example, with 193 nm wavelength.

Figure 4B:
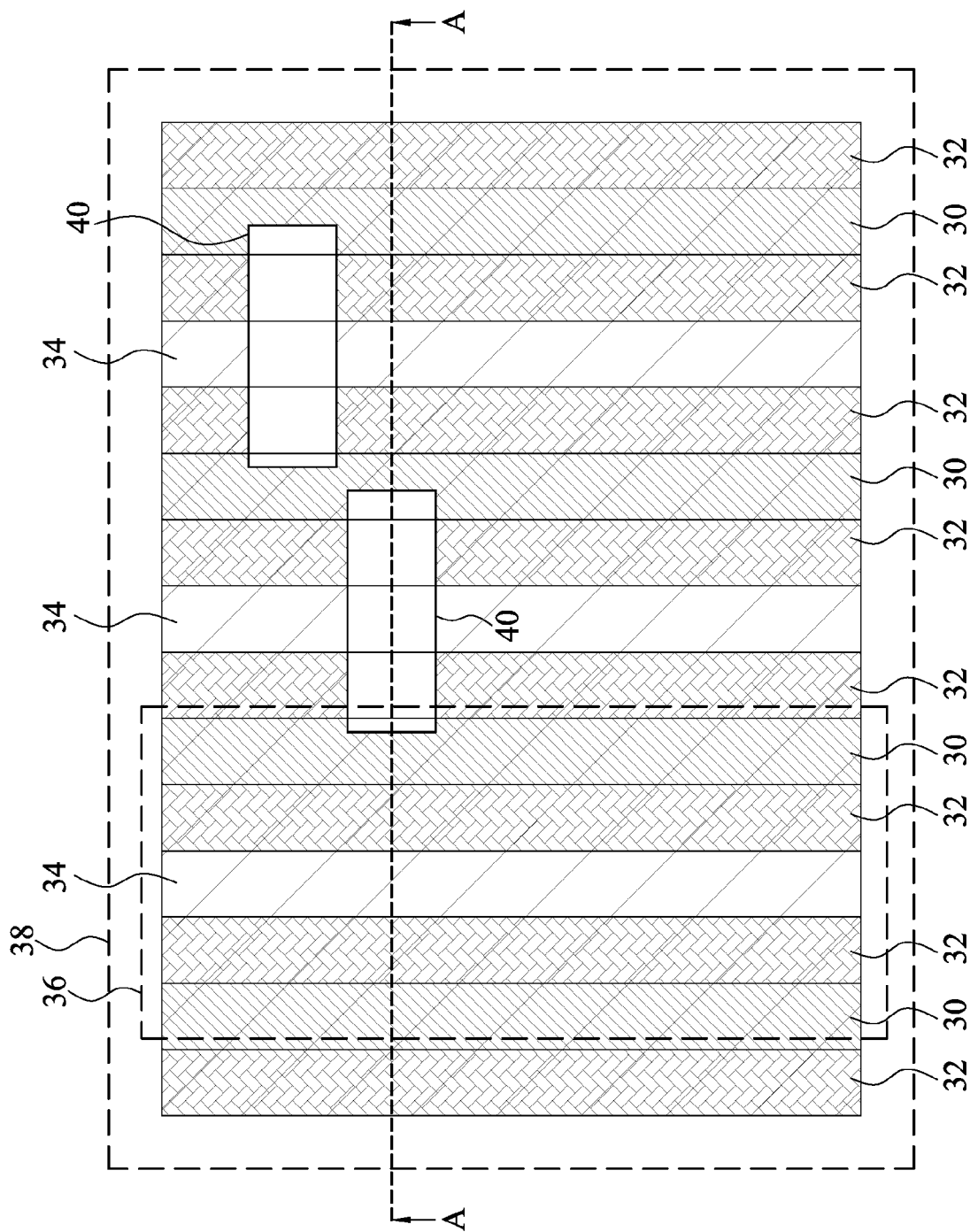

FIG. 4B illustrates a top view of the structure shown in FIG. 4A. The cross-sectional view shown in FIG. 4A is obtained from the reference cross-section A-A in FIG. 4B. As shown in FIG. 4B, etching mask 38 is formed throughout the illustrated region in wafer 10, with openings 40 formed in etching mask 38. Openings 40 cross the spaces 34, with each of spaces 34 being between two neighboring spacers 32.

Figure 5A:
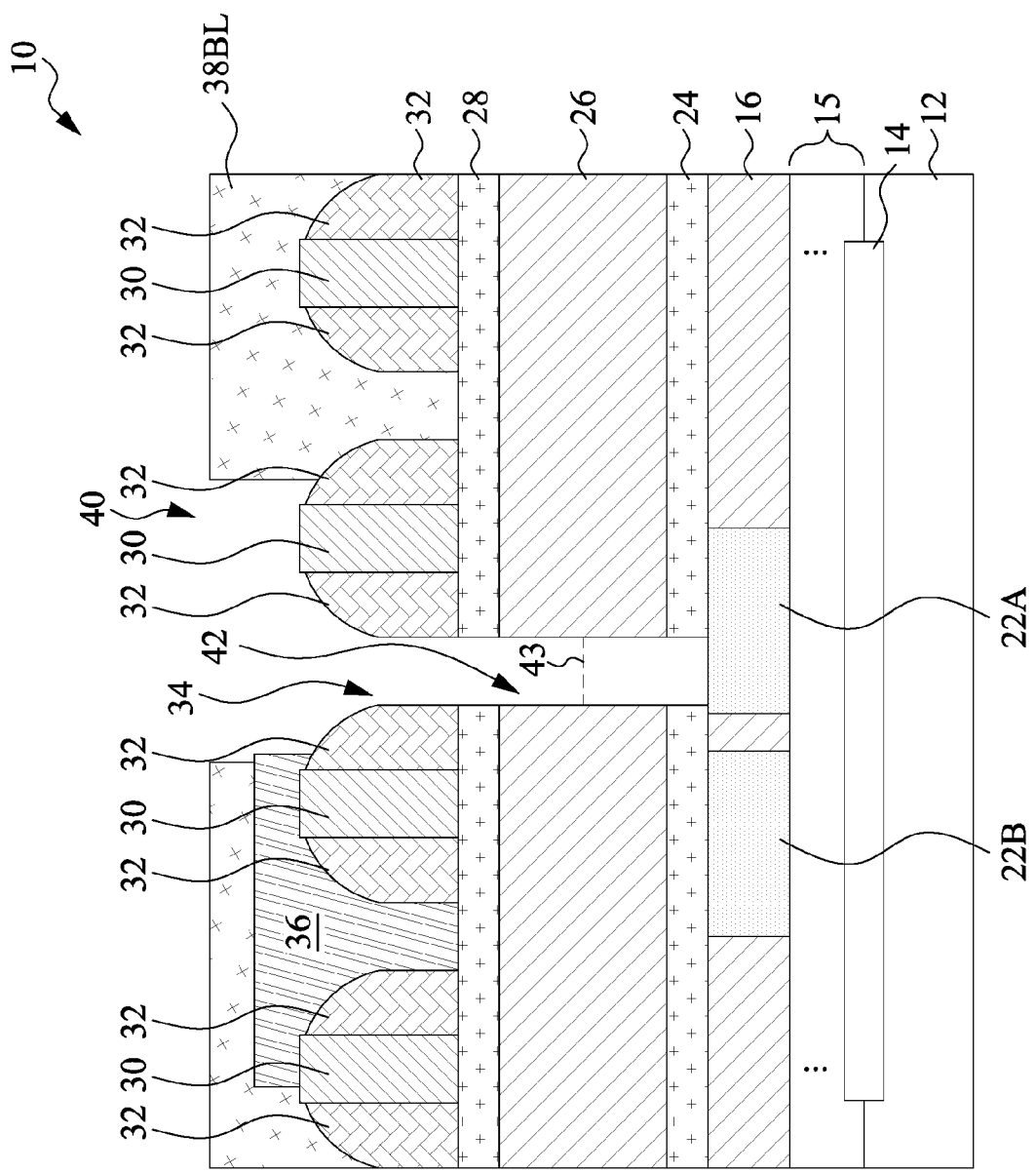

Next, middle layer 38ML (FIG. 4A) is etched using the patterned top layer 38TL as an etching mask, so that the opening 40 extends into middle layer 38ML. After middle layer 38ML is etched-through, bottom layer 38BL is further patterned, during which middle layer 38ML is used as an etching mask. During the patterning of bottom layer 38BL, top layer 38TL is consumed. Middle layer 38ML may be partially or fully consumed during the patterning of bottom layer 38BL. In the patterning of bottom layer 38BL, opening 40 extends downwardly, revealing mandrel 30 and spacers 32. The resulting structure is shown in FIG. 5A. Protection layer 36 may be or may not be revealed, depending on the size of opening 40 and the severity of overlay shift.

The etching process is continued to etch hard mask 28, so that via opening 42 is formed in hard mask 28. The respective process is illustrated as process 210 in the process flow 200 as shown in FIG. 21. Dielectric layer 26 is then etched, so that via opening 42 extends into (and possibly penetrates through) low-k dielectric layer 26. In accordance with some embodiments, the etching of dielectric layer 26 is performed using an etching gas selected from $C_4F_6$, $C_4F_8$, $C_5F_8$, $CF_4$, $CHF_3$, $CH_2F_2$, $NF_3$, $N_2$, $O_2$, Ar, He, and combinations thereof. In accordance with some embodiments, via opening 42 extends to the bottom of dielectric layer 26, and etch stop layer 24 is revealed. Next, etch stop layer 24 is removed in an etching process, which may be a dry etching process or a wet etching process. Conductive feature 22A is thus exposed to via opening 40. It is appreciated that protection layer 36 has the function of protecting undesirable portions of dielectric layer 26 from being etched. For example, if there is an overlay shift, and opening 40 is shifted left and overlaps the space 34 between the second and the third illustrated spacers 32 (counting from left), the portion of dielectric layer 26 under the space 34 may be undesirably etched if there is no protection layer 36 formed. Accordingly, protection layer 36 protects the undesirable portions of dielectric layer 26 from being etched when overlay shift occurs.

Figure 7A:
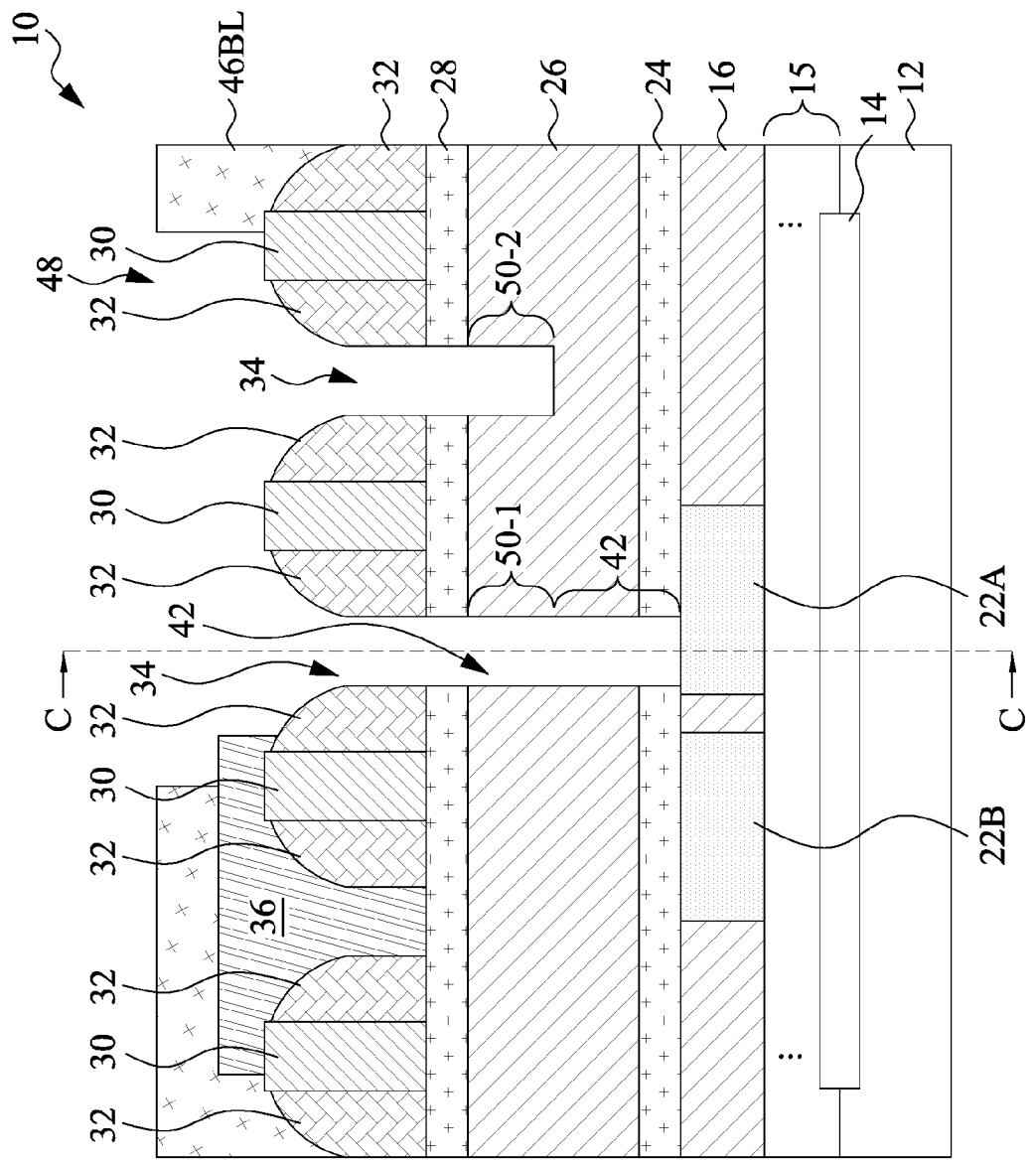

In accordance with alternative embodiments, instead of forming via opening 42 extending to conductive feature 22A, the formation of via opening 42 is stopped when the bottom of via opening 42 is at an intermediate level between the top surface and the bottom surface of dielectric layer 26, wherein dashed line 43 illustrates the intermediate level. In accordance with these embodiments, the via opening 42 will be extended downwardly in the subsequent formation of trenches, which process is shown in FIG. 7A.

Figure 5B:
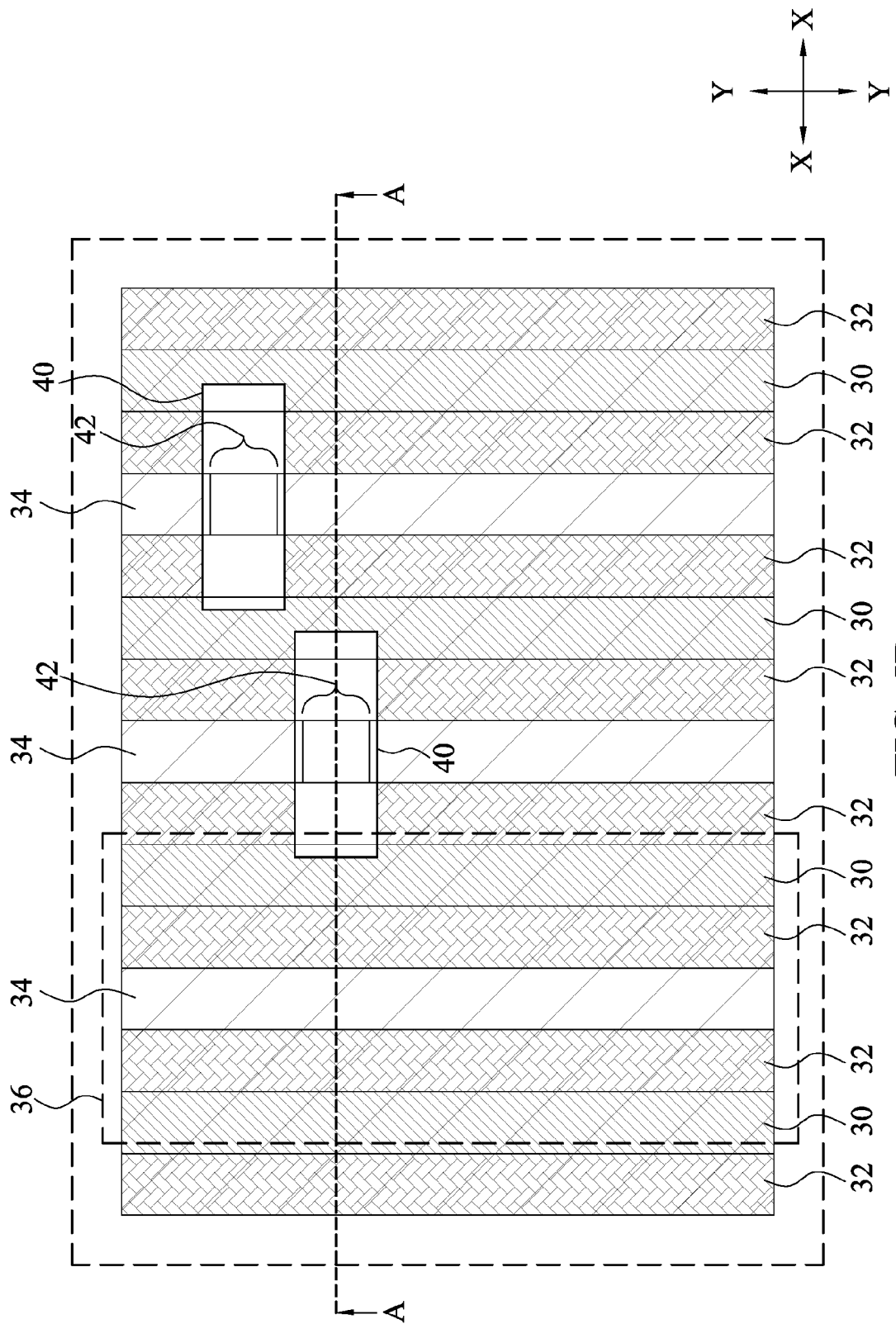

FIG. 5B illustrates a top view of the structure shown in FIG. 5A. The cross-sectional view shown in FIG. 5A is obtained from the reference cross-section A-A in FIG. 5B. The widths (measured in Y-direction) of openings 42 are illustrated as being slightly smaller than the width of the corresponding openings 40 for easy distinction, while the widths of openings 42 may actually be equal to the widths of the corresponding openings 40. As shown in FIG. 5B, in accordance with some embodiments, spacers 32 define the dimensions of openings 42 in the X-direction, while openings 40 in etching mask 38 define the dimensions of openings 42 in the Y-direction. After the formation of opening 42, bottom layer 38BL (FIG. 5A) is removed, for example, using a process gas comprising $CO_2$, $NH_3$, $O_2$, or combinations thereof.

Figure 6A:
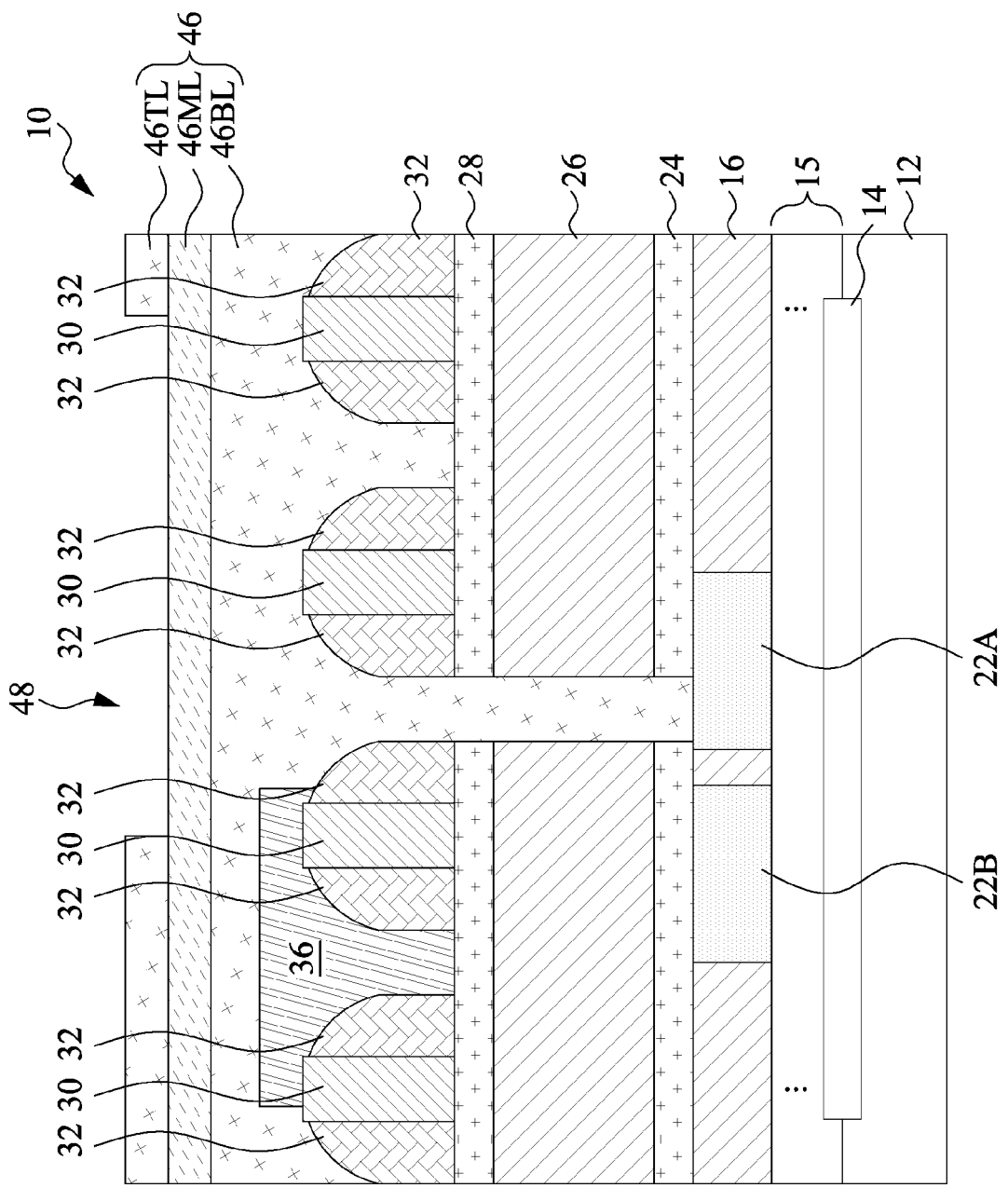

FIGS. 6A, 6B, 7A, 7B, 7C, and 8 illustrate the processes for forming a first plurality of trenches. Referring to FIG. 6A, a second etching mask 46, which may be a tri-layer, is formed, which tri-layer includes bottom layer 46BL, middle layer 46ML over bottom layer 46BL, and top layer 46TL over middle layer 46ML. The respective process is illustrated as process 212 in the process flow 200 as shown in FIG. 21. The materials of bottom layer 46BL, middle layer 46ML, and top layer 46TL may be similar to the materials of bottom layer 38BL, middle layer 38ML, and top layer 38TL, respectively. Top layer 46TL is patterned to form opening 48, which is used to define a trench or trenches in low-k dielectric layer 26. The lithography process in the patterning of top layer 46TL may be performed using an EUV light, for example, with 193 nm wavelength.

Figure 6B:
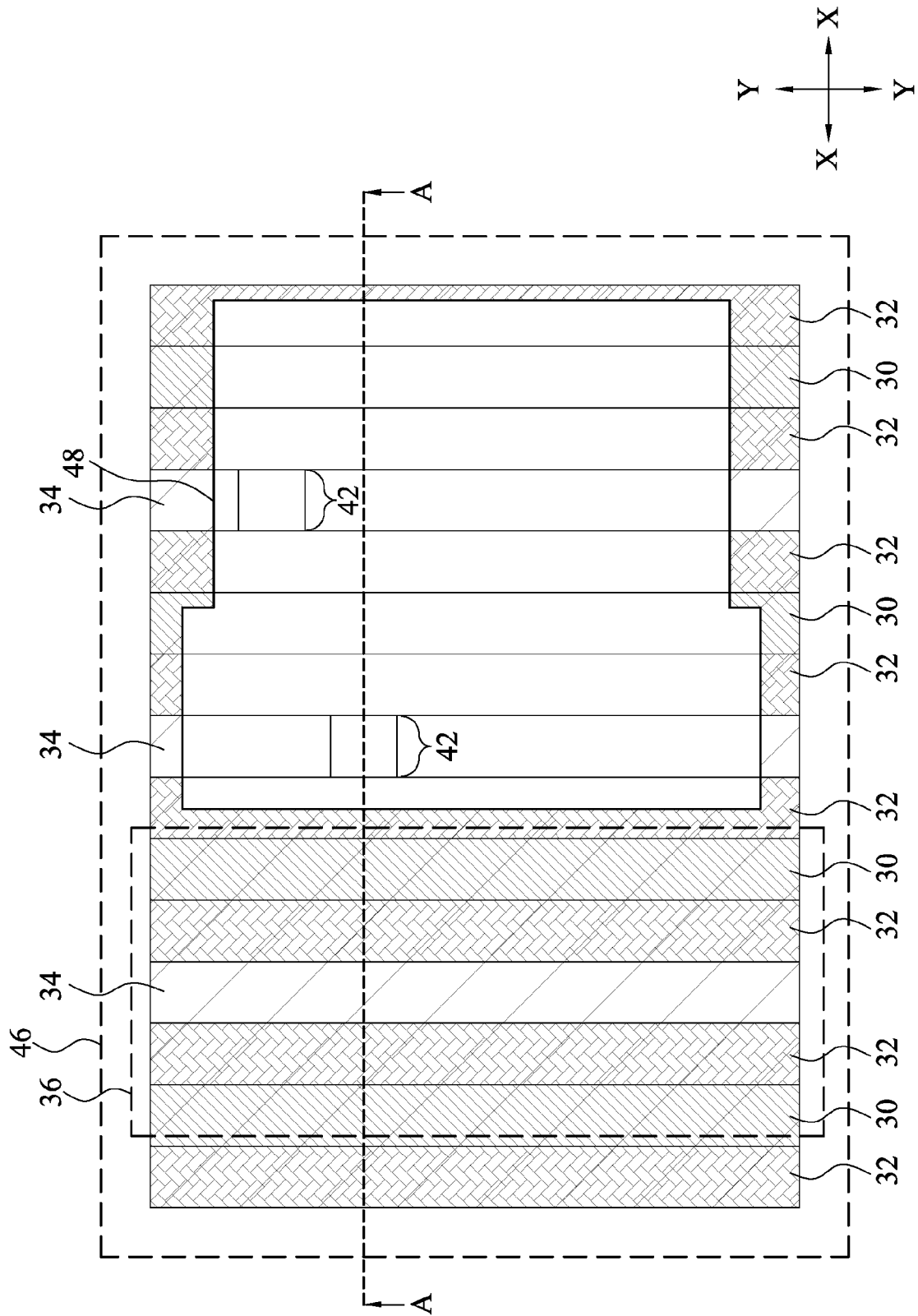

FIG. 6B illustrates a top view of the structure shown in FIG. 6A. The cross-sectional view shown in FIG. 6A is obtained from the reference cross-section A-A in FIG. 6B. As shown in FIG. 6B, the previously formed via openings 42 are directly underlying opening(s) 48. There may be some openings 48, wherein under each of the openings 48, wherein is a single opening 42. There may also be some other openings 48, wherein under each of the openings 48, there are a plurality of via openings 42, as shown in FIG. 6B.

Next, the middle layer 46ML (FIG. 6A) is etched using the patterned top layer 46TL as an etching mask, so that the opening 48 extends into middle layer 46ML. After middle layer 46ML is etched-through, bottom layer 46BL is patterned, during which middle layer 46ML is used as an etching mask. During the patterning of bottom layer 46BL, top layer 46TL is consumed. Middle layer 46ML may be partially or fully consumed during the patterning of bottom layer 46BL. In the patterning of bottom layer 46BL, opening 48 extends downwardly, revealing the underlying mandrels 30 and spacers 32. Protection layer 36 may be or may not be revealed, depending on the size of opening 48 and the severity of overlay shift. The resulting structure is shown in FIG. 7A. It is appreciated that protection layer 36 may protect undesirable portions of dielectric layer 26 from being patterned. For example, if there is an overlay shift, and opening 48 is shifted to left and overlaps the space 34 between the second and the third illustrated spacers 32, the portion of dielectric layer 26 under space 34 may be undesirably etched if there is no protection layer 36. Accordingly, protection layer 36 protects the undesirable portions of dielectric layer 26 from being etched in the formation of trenches.

Figure 7B:
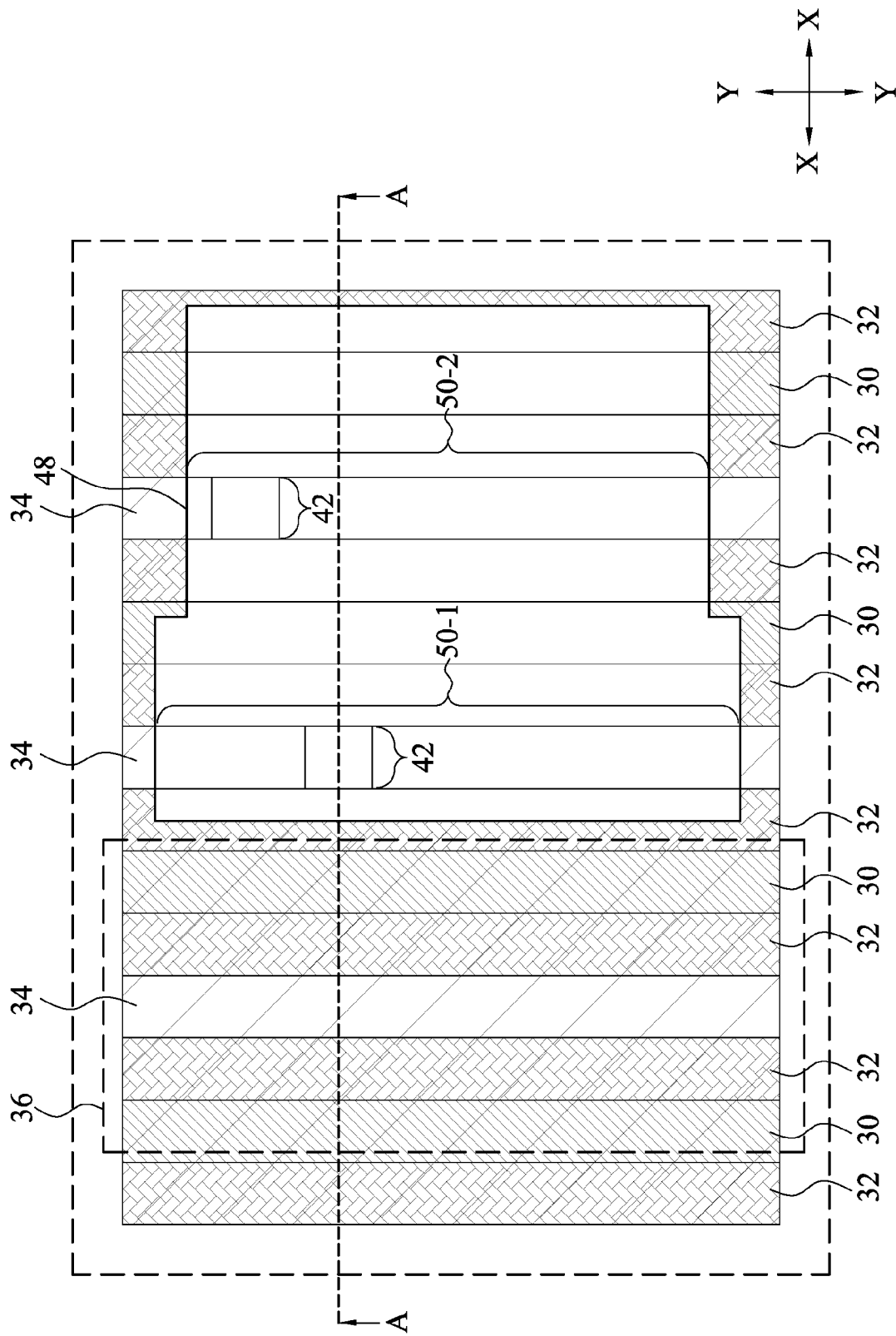
Figure 7C:
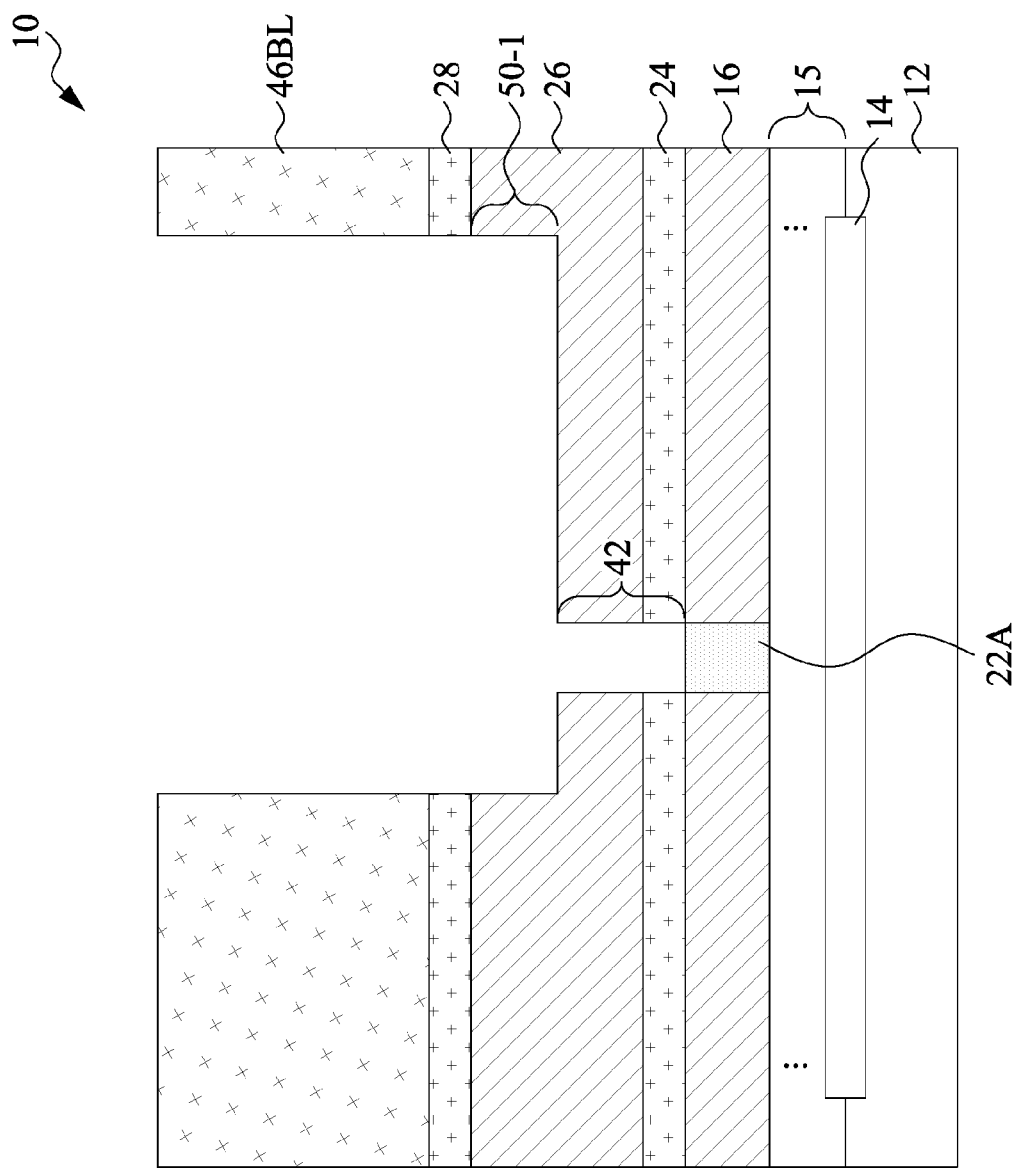

The etching process is continued to etch hard mask 28, wherein the etched portion is not shown in FIGS. 6A and 7A, but can be realized through FIG. 6B. Next, dielectric layer 26 is etched, so that trenches 50-1 and 50-2 are formed in hard mask 28, which are individually and collectively referred to as trenches 50. The respective process is illustrated as process 214 in the process flow 200 as shown in FIG. 21. In accordance with some embodiments, the etching of dielectric layer 26 is performed using an etching gas selected from $C_4F_6$, $C_4F_8$, $C_5F_8$, $CF_4$, $CHF_3$, $CH_2F_2$, $NF_3$, $N_2$, $O_2$, Ar, He, and combinations thereof. Trench 50-1 is joined with via opening 42, as shown in FIG. 7C, which shows the reference cross-section C-C in FIG. 7A. Trench 52-2 may be over and joined with another via opening 42, as shown in FIG. 7B. Trenches 50-1 and 50-2 extend to an intermediate level between the top surface and the bottom surface of dielectric layer 26. In accordance with some embodiments, via opening 42 already extends to conductive feature 22A when the process shown in FIG. 5A is finished. In accordance with alternative embodiments in which the bottom of via opening 42 extends to the level marked with dashed line 43 (FIG. 5A) when the process shown in FIG. 5A is finished, via opening 42 extends downwardly during the same etching process for forming trenches 50, and via opening 42 stops on the top surface of etch stop layer 24. An etching process(es) may then be performed to etch-through etch stop layer 24 and to reveal conductive feature 22A.

Figure 8:
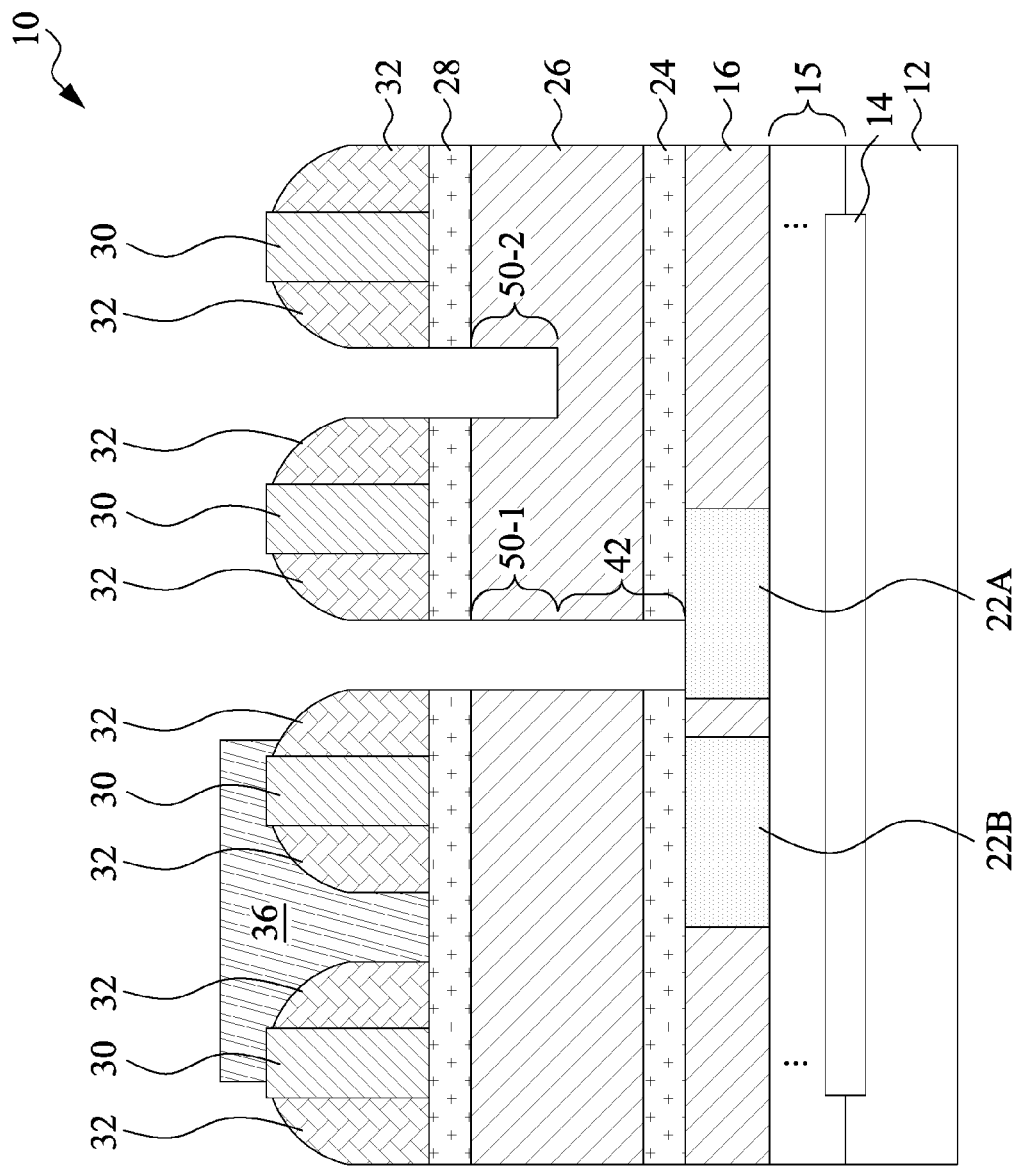

FIG. 7B illustrates a top view of the structure shown in FIG. 7A. The cross-sectional view shown in FIG. 7A is obtained from the reference cross-section A-A in FIG. 7B. As shown in FIG. 7B, in accordance with some embodiments, spacers 32 define the dimensions of trenches 50-1 and 50-2 in the X-direction, while opening 48 in etching mask 46 defines the dimensions of trenches 50-1 and 50-2 in the Y-direction. After the formation of trenches 50-1 and 50-2, bottom layer 46BL is removed, for example, using a process gas comprising $CO_2$, $NH_3$, $O_2$, or combinations thereof. The resulting structure is shown in FIG. 8.

Figure 9:
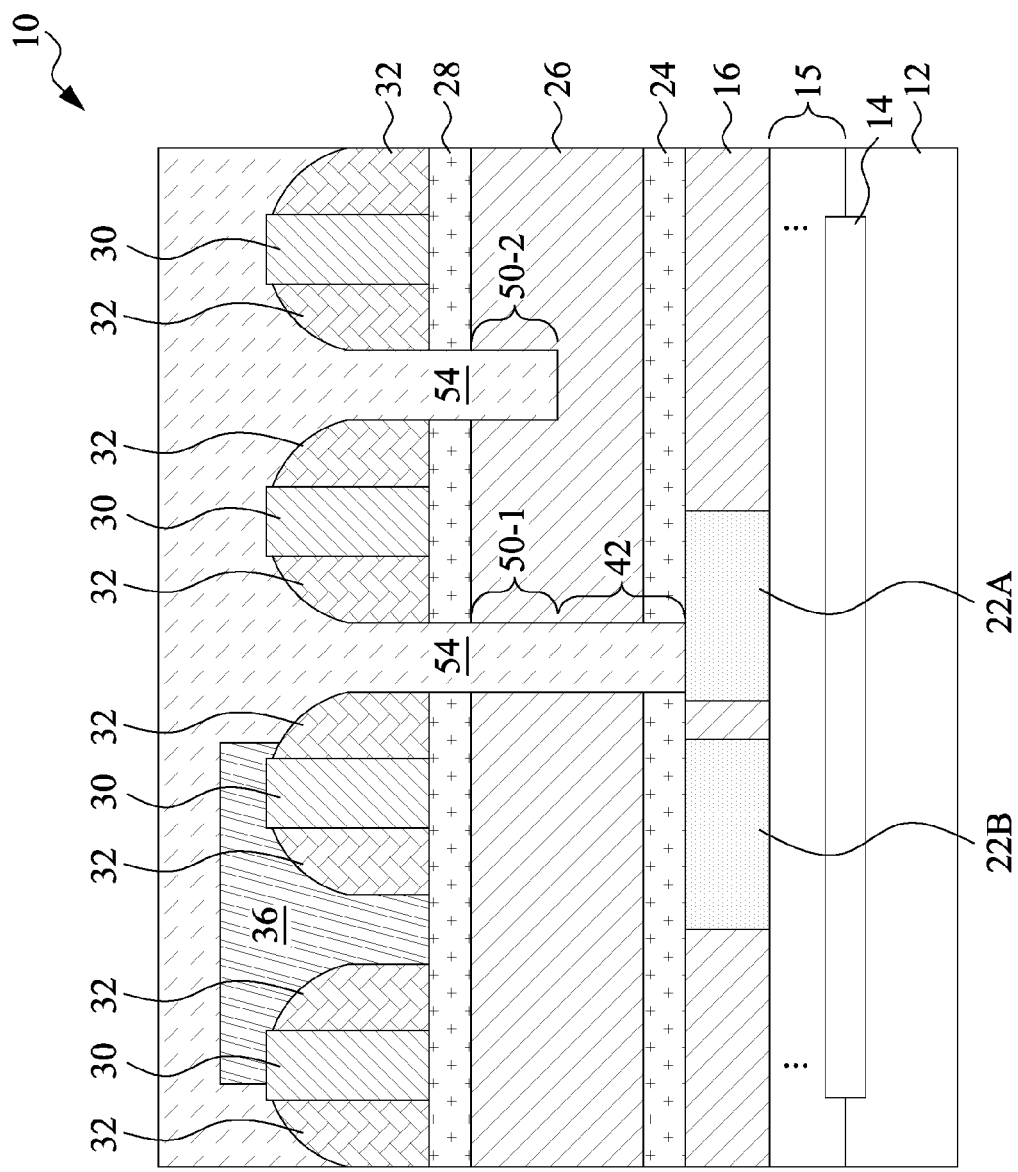

FIG. 9 illustrates the formation of conductive material 54 to fill via opening 42 and trenches 50. The respective process is illustrated as process 216 in the process flow 200 as shown in FIG. 21. In accordance with some embodiments, a metallic material such as cobalt, tungsten, or the like, or combinations thereof, is filled, which may be formed using a barrier-less process, wherein no barrier is formed, and the metallic material is in physical contact with conductive feature 22A and dielectric layer 26. In accordance with alternative embodiments, the conductive material may include a barrier and a metallic material on the diffusion barrier. The barrier may be formed of titanium, titanium nitride, tantalum, tantalum nitride, or the like. The metallic material may be formed of or comprise copper.

Figure 10:
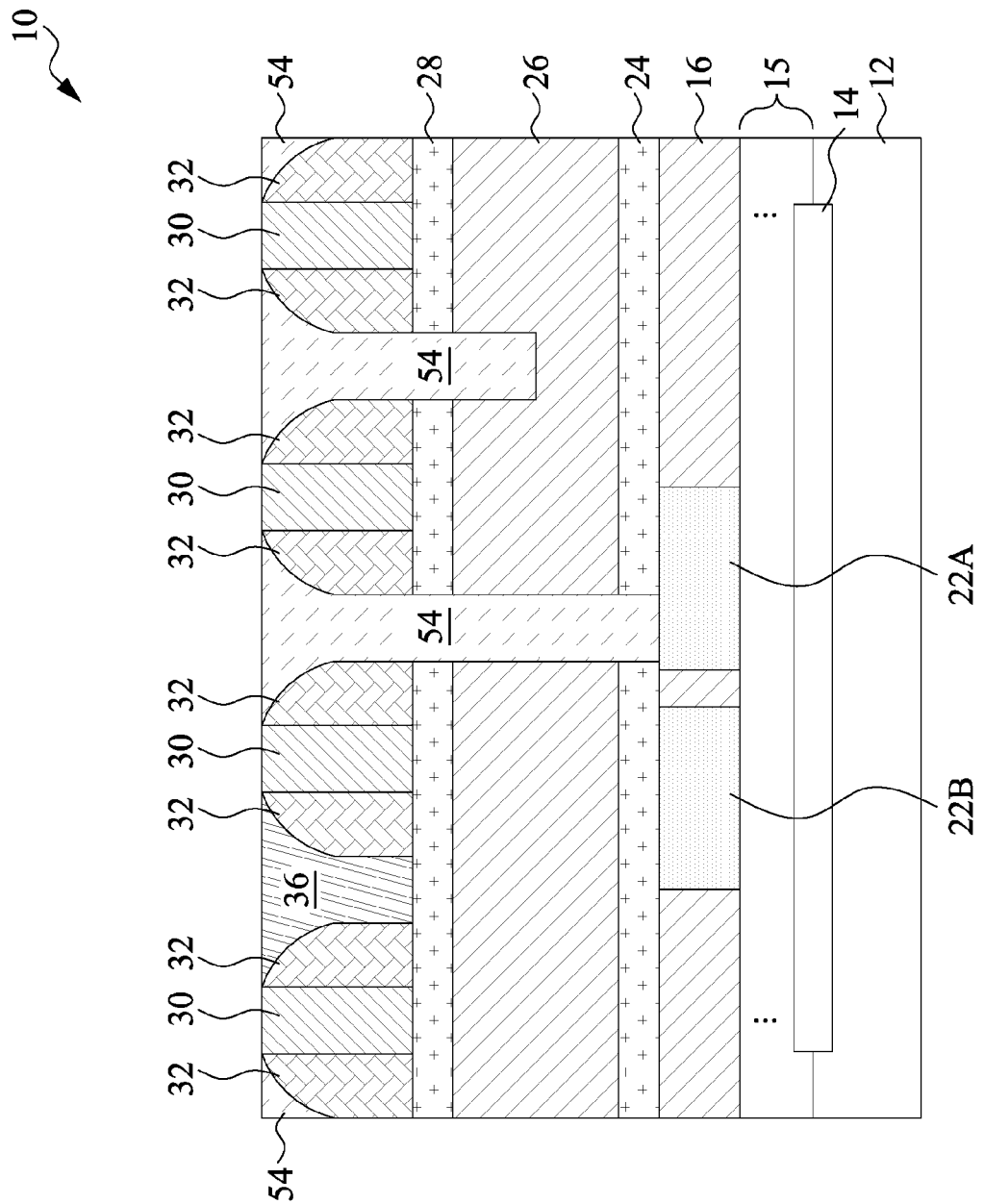

In a subsequent process, a planarization process such as a Chemical Mechanical Polish (CMP) process or a mechanical polishing process may be performed to remove excess portions of conductive material 54 and protection layer 36, revealing mandrels 30. Mandrels 30 and/or spacers 32 may be used as the CMP stop layer. The respective process is illustrated as process 218 in the process flow 200 as shown in FIG. 21. The resulting structure is shown in FIG. 10.

FIGS. 11 through 18 illustrate a second patterning process of the double-patterning process for forming vias and metal lines. The processes are similar to the processes shown in preceding figures, except that the vias and metal lines, instead being formed through the spaces between spacers 32, are formed by removing mandrels 30 to generate new spaces, and forming the vias and metal lines through the newly generated spaces.

Figure 11:
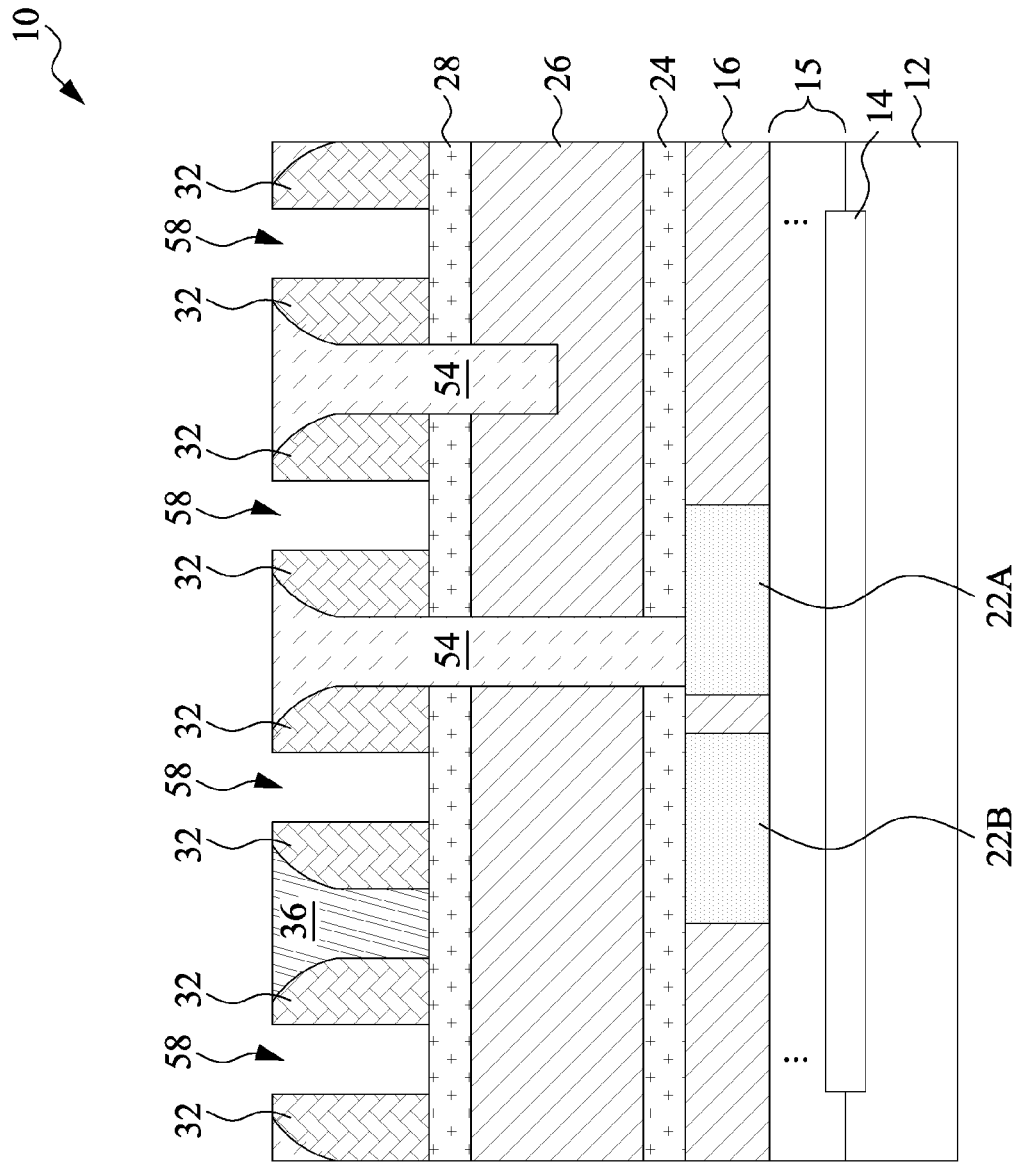
Figure 12:
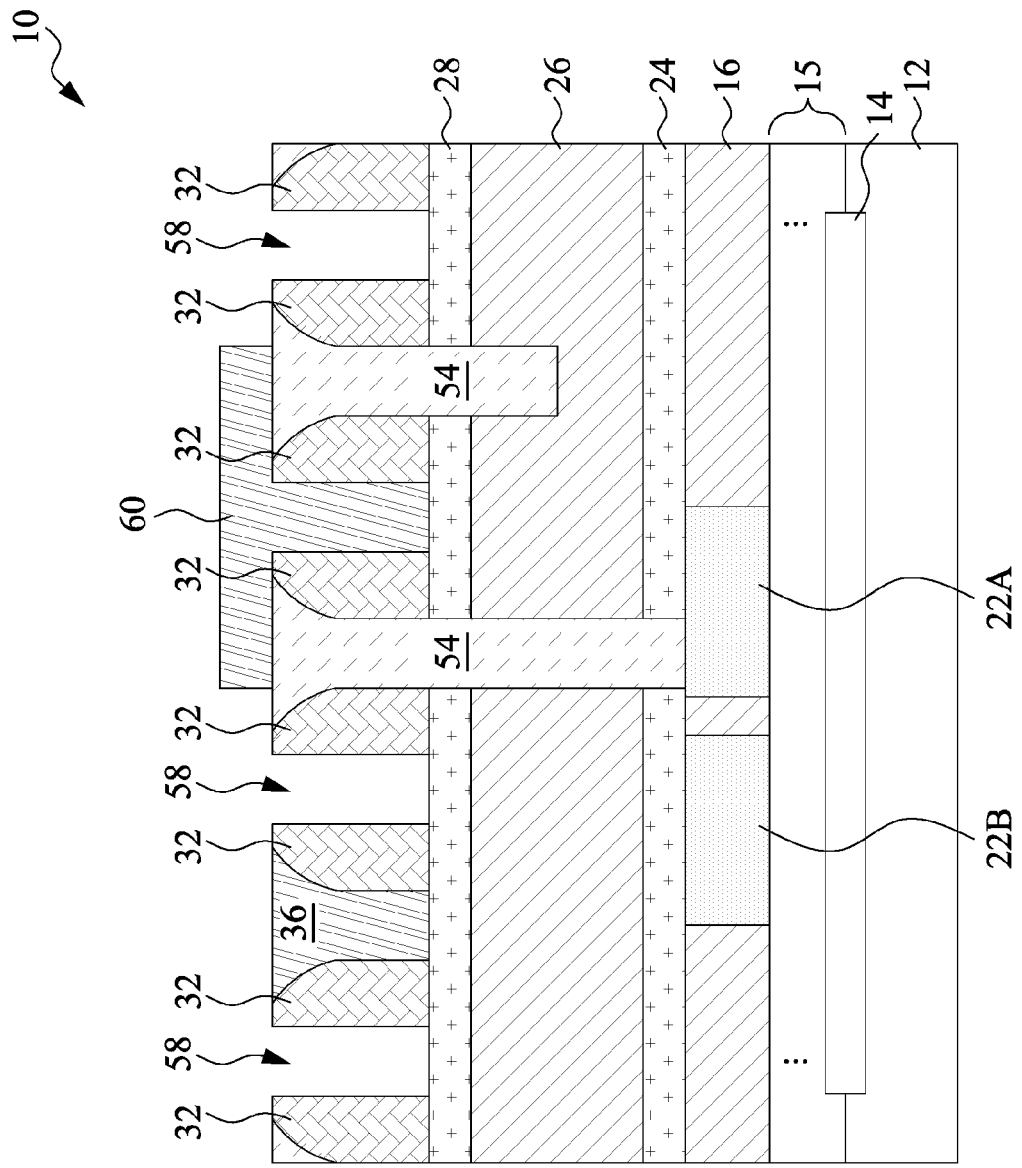

Referring to FIG. 11, mandrels 30 (FIG. 10) are removed in an etching process. The respective process is illustrated as process 220 in the process flow 200 as shown in FIG. 21. Openings 58 are thus formed between neighboring spacers 32, exposing the underlying hard mask layer 28. In accordance with some embodiments, all of mandrels 30 on wafer 10 are removed. In accordance with alternative embodiments, some portions of mandrels 30 are removed, while some portions of mandrels 30 are left unremoved. Next, as shown in FIG. 12, protection layer 60 is formed and fills some parts of openings 58. The respective process is illustrated as process 222 in the process flow 200 as shown in FIG. 21. Protection layer 60 may be formed of or comprises a similar material, and may be selected from the same group of candidate materials, as that of protection layer 36. Furthermore, protection layer 60 is formed of or comprises a material that is different from the materials of spacers 32 (and mandrels 30, if any left) and hard mask 28, so that in the patterning of protection layer 60, spacers 32 (and mandrels 30) are not damaged. In accordance with some embodiments, protection layer 60 may be (or may not be) formed of or comprise titanium oxide, titanium nitride, silicon oxide, or the like. The formation of protection layer 60 includes depositing a blanket layer, and then performing an etching process to pattern and remove the undesirable portions of the protection layer 60. The etching process may be performed using gases including $O_2$, $CO_2$, $NH_3$, and/or the like. The lithography process in the patterning may be performed using an EUV light, for example, with 193 nm wavelength.

Figure 13:
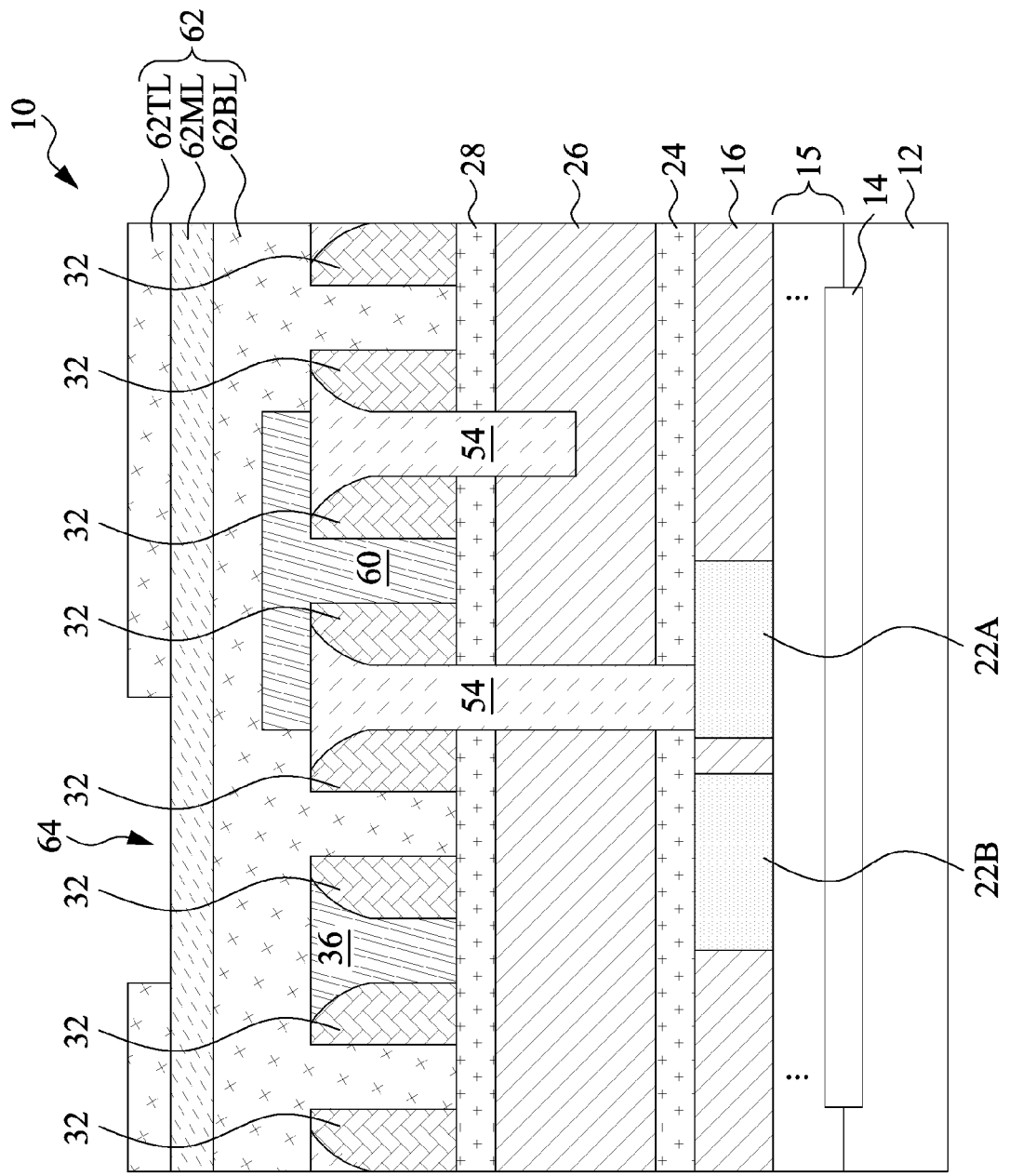

Referring to FIG. 13, a third etching mask 62, which may be a tri-layer, is formed. Etching mask 62 may include bottom layer (also sometimes referred to as under layer) 62BL, middle layer 62ML over bottom layer 62BL, and top layer (also sometimes referred to as an upper layer) 62TL over middle layer 62ML. The respective process is illustrated as process 224 in the process flow 200 as shown in FIG. 21. The materials and the structure of etching mask 62 may be similar to the materials and the structure of etching mask 38 (FIG. 4A). Top layer 62TL is patterned to form opening 64, which is used to define a via opening in low-k dielectric layer 26. The lithography process in the patterning may be performed using a EUV light, for example, with 193 nm wavelength. The top view shape of opening 64 may be similar to that of openings 40 shown in FIG. 4B or may be rectangles, and are not discussed in detail herein.

Next, middle layer 62ML and bottom layer 62BL are patterned, so that opening 64 extends into, and penetrates through, middle layer 62ML and bottom layer 62BL. Spacers 32 are thus revealed. Protection layers 36 and 60 may be or may not be revealed, depending on the size of opening 64 and the severity of overlay shift.

Figure 14:
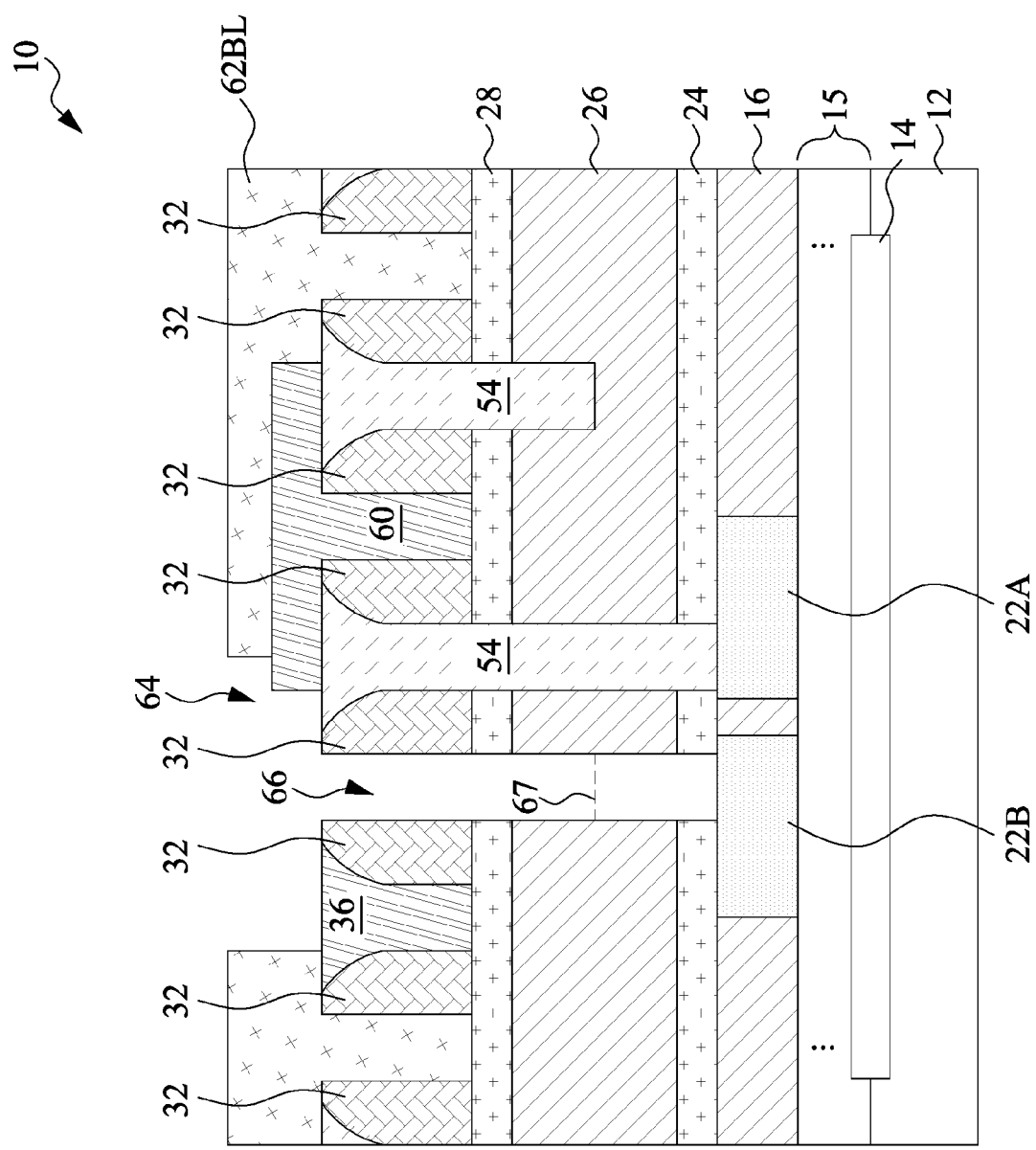

The etching process is continued to etch hard mask 28, so that via opening 66 is formed in hard mask 28, as shown in FIG. 14. The respective process is illustrated as process 226 in the process flow 200 as shown in FIG. 21. Dielectric layer 26 is then etched, so that via opening 66 extends into dielectric layer 26. In accordance with some embodiments, the etching of dielectric layer 26 is performed using an etching gas selected from $C_4F_6$, $C_4F_8$, $C_5F_8$, $CF_4$, $CHF_3$, $CH_2F_2$, $NF_3$, $N_2$, $O_2$, Ar, He, and combinations thereof. In accordance with some embodiments, via opening 66 extends to the bottom of dielectric layer 26, and etch stop layer 24 is revealed. Next, etch stop layer 24 is removed in an etching process, which may be a dry etching process or a wet etching process. Conductive feature 22B is thus exposed to via opening 66. The resulting structure is shown in FIG. 14. During the etching process, protection layers 36 and 60 may protect the undesirable portions of dielectric layer 26 from being patterned if severe overlay shift occurs.

In accordance with alternative embodiments, instead of forming via opening 66 as extending all the way to conductive feature 22B, the formation of via opening 66 is stopped when the bottom of via opening 66 is in the intermediate level between the top surface and the bottom surface of dielectric layer 26, wherein dashed line 67 illustrates the intermediate level.

Figure 15:
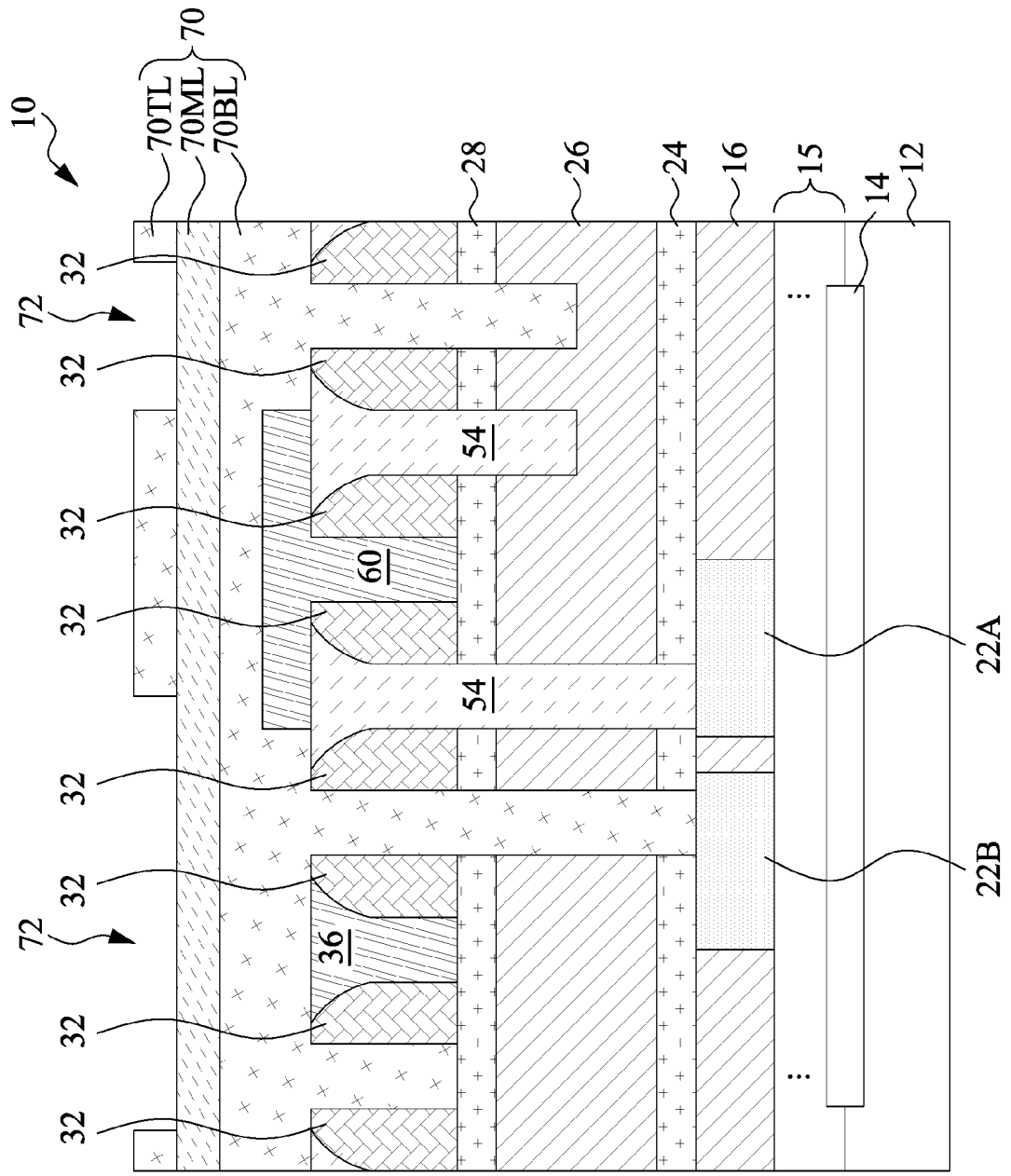
Figure 16:
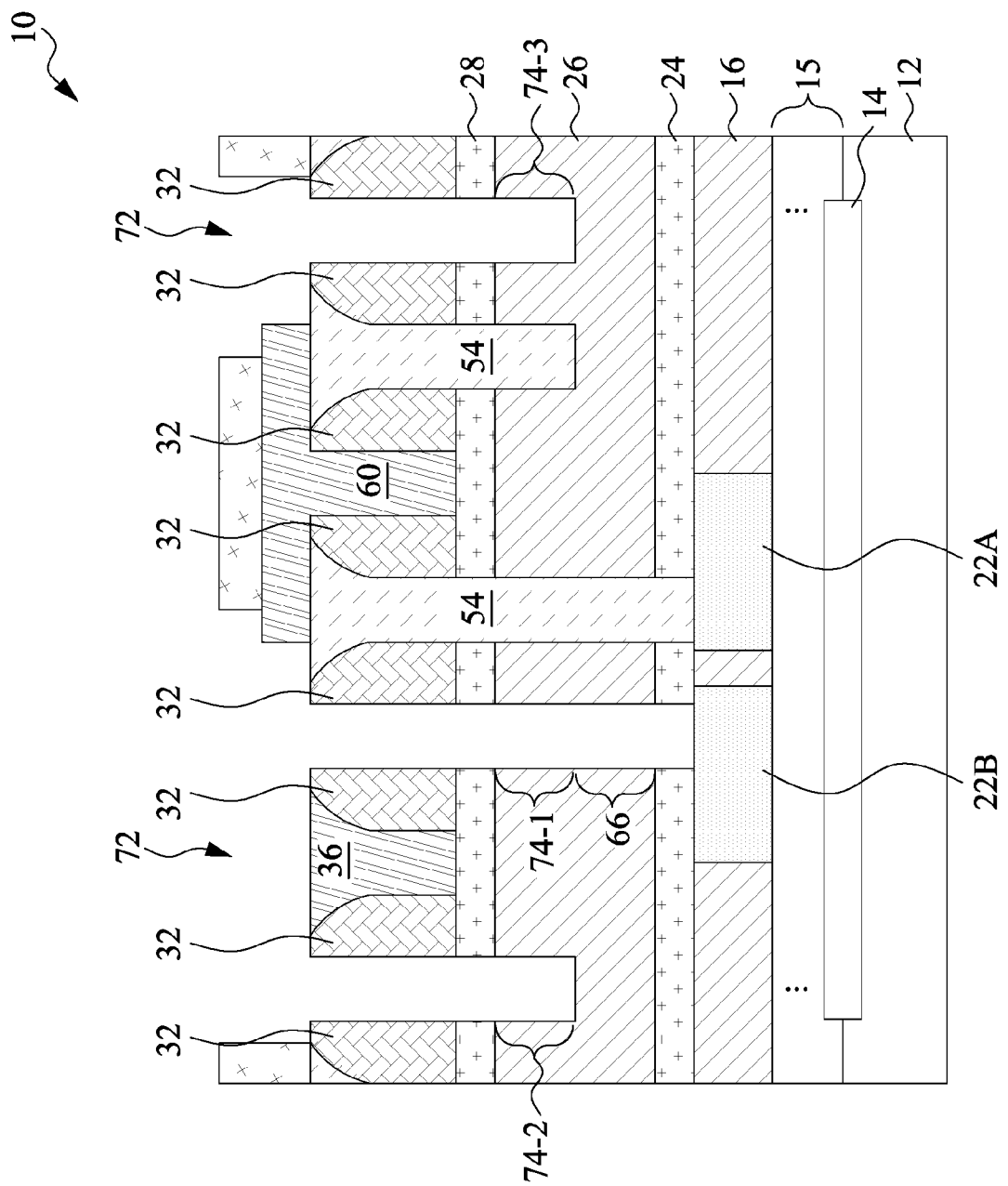
Figure 17:
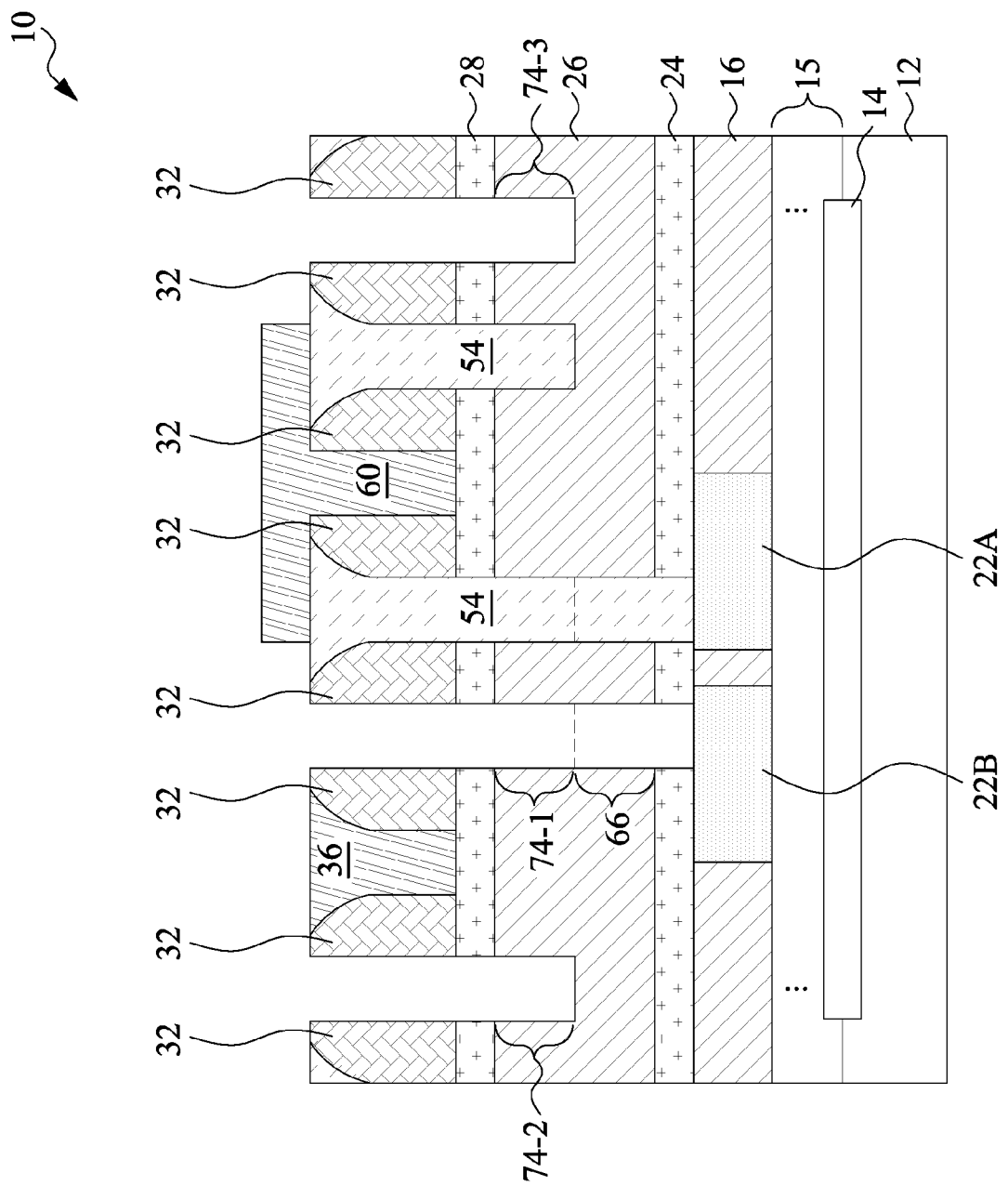

FIGS. 15 through 17 illustrate the processes for forming a second plurality of trenches. Referring to FIG. 15, a fourth etching mask 70, which may be a tri-layer, is formed. Etching mask 70 may include bottom layer 70BL, middle layer 70ML over bottom layer 70BL, and top layer 70TL over middle layer 70ML. The respective process is illustrated as process 228 in the process flow 200 as shown in FIG. 21. The materials of bottom layer 70BL, middle layer 70ML, and top layer 70TL may be similar to the materials of bottom layer 62BL, middle layer 62ML, and top layer 62TL, respectively. Top layer 70TL is patterned to form openings 72, which are used to define the pattern of trench (trenches) in low-k dielectric layer 26. The lithography process in the patterning may be performed using an EUV light, for example, with 193 nm wavelength. The relationship of opening 72 and the corresponding via opening(s) 66 are similar to what are shown in FIG. 6B, and may be realized.

Next, the middle layer 70ML (FIG. 15) is etched using the patterned top layer 70TL as an etching mask, so that opening 72 extends into middle layer 70ML. Next, middle layer 70ML and bottom layer 70BL are patterned, so that openings 72 extend into, and penetrate through, middle layer 70ML and bottom layer 70BL. Spacers 32 are thus revealed. Protection layers 36 and 60 may be or may not be revealed, depending on the size of openings 72, the severity of overlay shifting, and the positions of openings 72. Protection layers 36 and 60, if revealed, may protect undesirable portions of dielectric layer 26 from being patterned.

The etching is continued to etch hard mask 28, wherein the etched portion is not shown in FIG. 15. Next, as shown in FIG. 16, dielectric layer 26 is etched, so that trenches 74-1, 74-2, and 74-3 are formed in hard mask 28, which are individually and collectively referred to as trenches 74. The respective process is illustrated as process 230 in the process flow 200 as shown in FIG. 21. In accordance with some embodiments, the etching of dielectric layer 26 is performed using similar process gases as used in the preceding etching process. Trench 74-1 is joined with via opening 66, similar to what is shown in FIG. 7C. Trenches 74-2 and 74-3 may be over and joined with other via openings 66 that are not in the illustrated plane. Trenches 74-1, 74-2, and 74-3 extend to an intermediate level between the top surface and the bottom surface of dielectric layer 26. In accordance with some embodiments, via opening 66 already extends to conductive feature 22A as a result of the process shown in FIG. 14. In accordance with alternative embodiments in which the bottom of via opening 66 extends to the intermediate level marked with dashed line 67 (FIG. 14), via opening 66 extends downwardly when trenches 74 are formed, and via opening 66 stops on the top surface of etch stop layer 24. An etching process(es) may then be performed to etch-through etch stop layer 24 and to reveal conductive feature 22B. After the formation of trenches 74-1, 74-2, and 74-3, the remaining bottom layer 70BL is removed, for example, using a process gas comprising $CO_2$, $NH_3$, $O_2$, or combinations thereof. The resulting structure is shown in FIG. 17.

Figure 18:
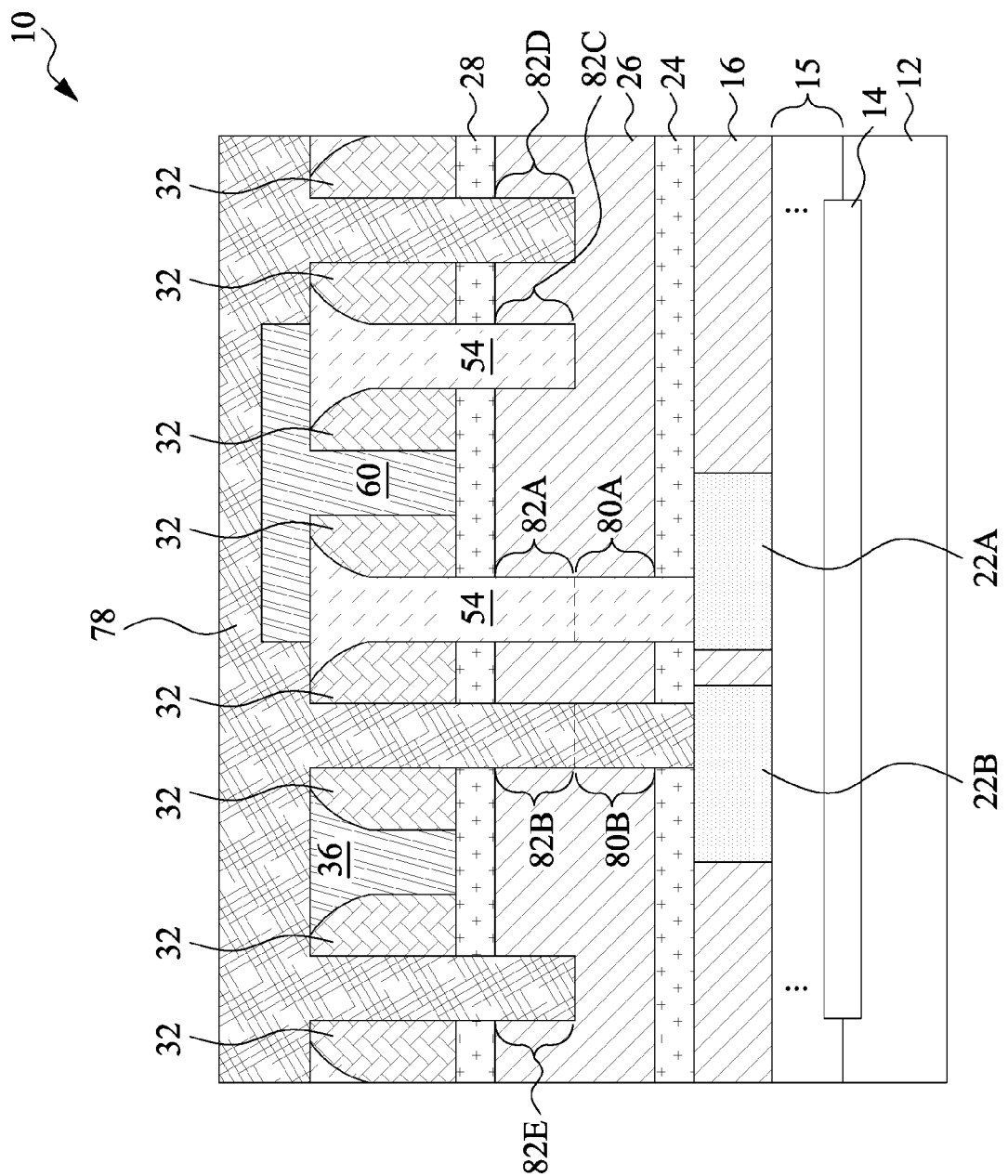

FIG. 18 illustrates the formation of conductive material 78 filling via opening 66 and trenches 74. The respective process is illustrated as process 232 in the process flow 200 as shown in FIG. 21. In accordance with some embodiments, a metallic material such as cobalt, tungsten, or the like, or combinations thereof, is deposited. The deposition may be performed using a barrier-less process, wherein no barrier is formed, and the metallic material is in contact with conductive feature 22A and dielectric layer 26. In accordance with alternative embodiments, the conductive material may include a barrier and a metallic material on the diffusion barrier. The barrier may be formed of titanium, titanium nitride, tantalum, tantalum nitride, or the like. The metallic material may be formed of or comprise copper.

Figure 19A:
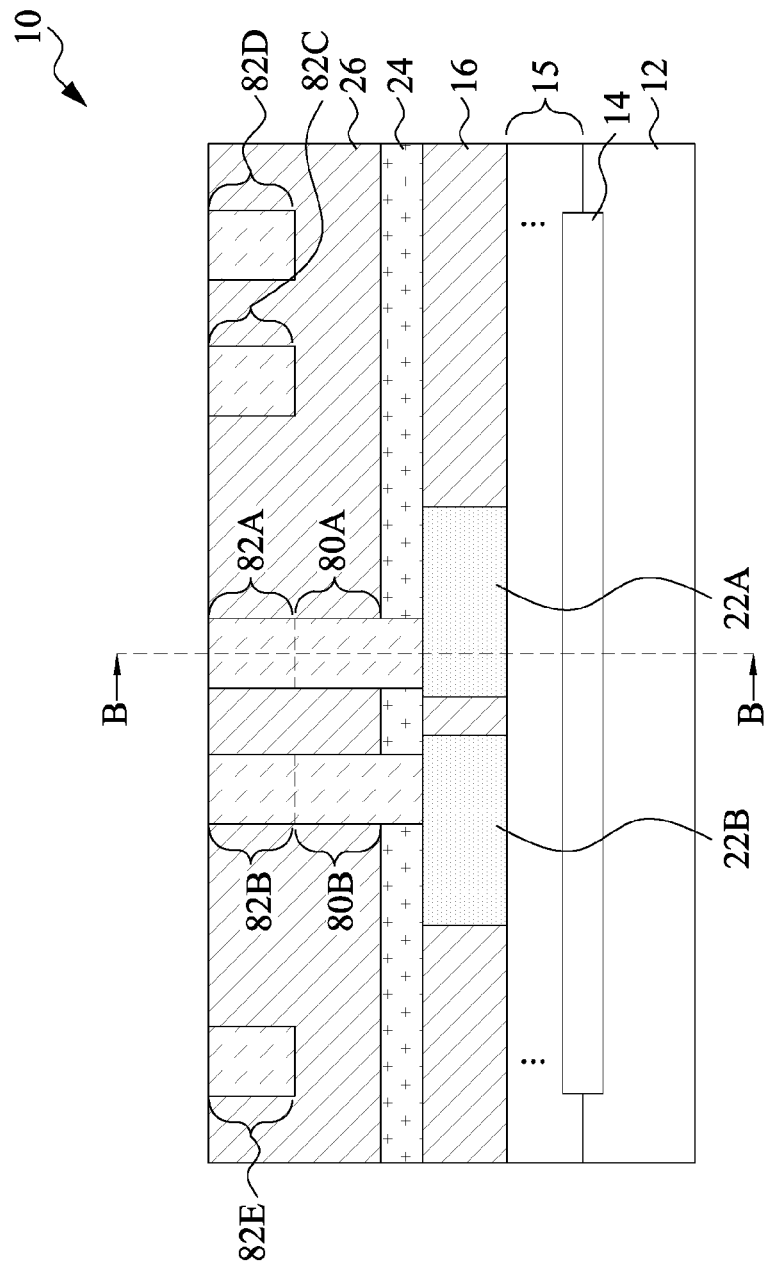
Figure 19B:
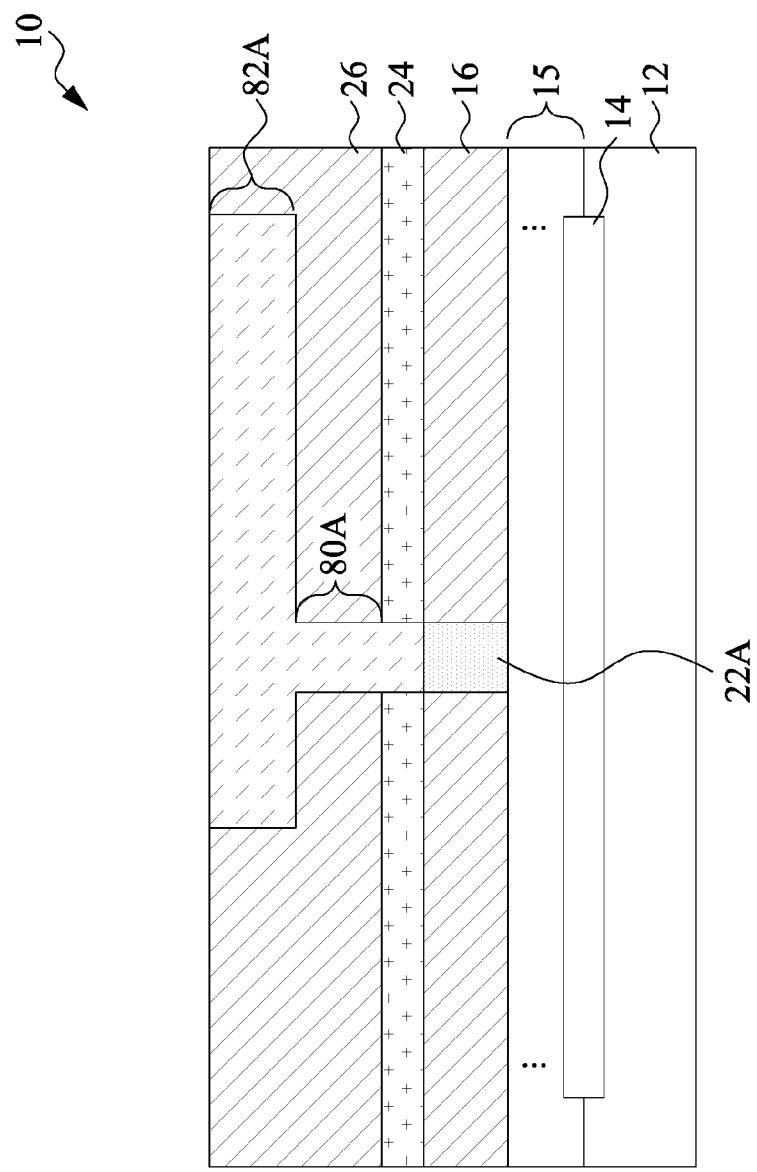

In a subsequent process, a planarization process such as a CMP process or a mechanical polishing process is performed to remove excess conductive material 78 over dielectric layer 26. The planarization process may be performed until spacers 32, protection layers 36 and 60, and hard mask layer 28 are removed, and dielectric layer 26 is revealed. The resulting structure is shown in FIG. 19A. Vias 80A and 80B (individually and collectively referred to as vias 80) and metal lines 82A, 82B, 82C, 82D, and 82E (individually and collectively referred to as metal lines 82) are formed. The respective process is illustrated as process 234 in the process flow 200 as shown in FIG. 21. FIG. 19B illustrates the reference cross-section B-B in FIG. 19A.

Figure 20:
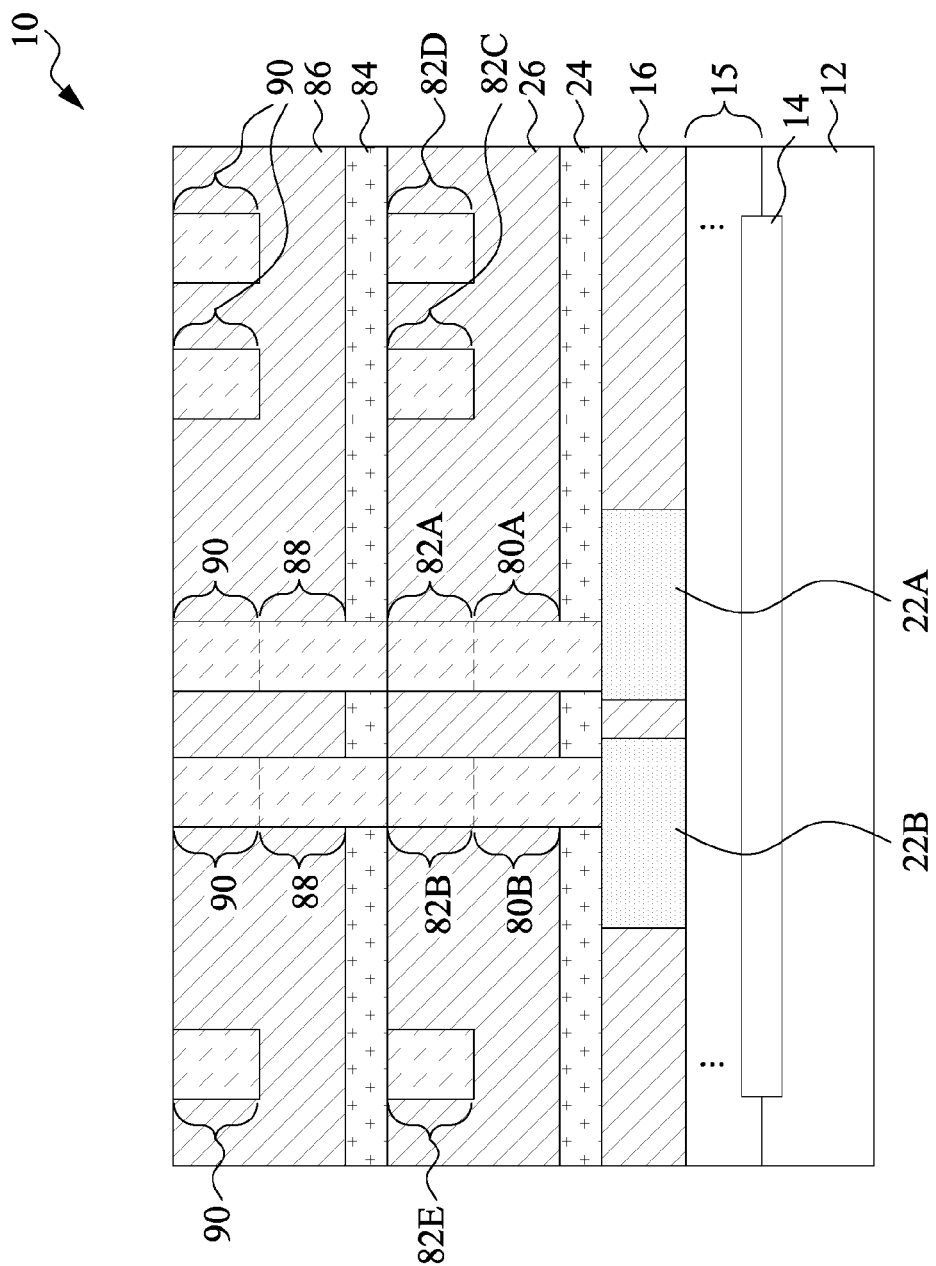
Figure 21:
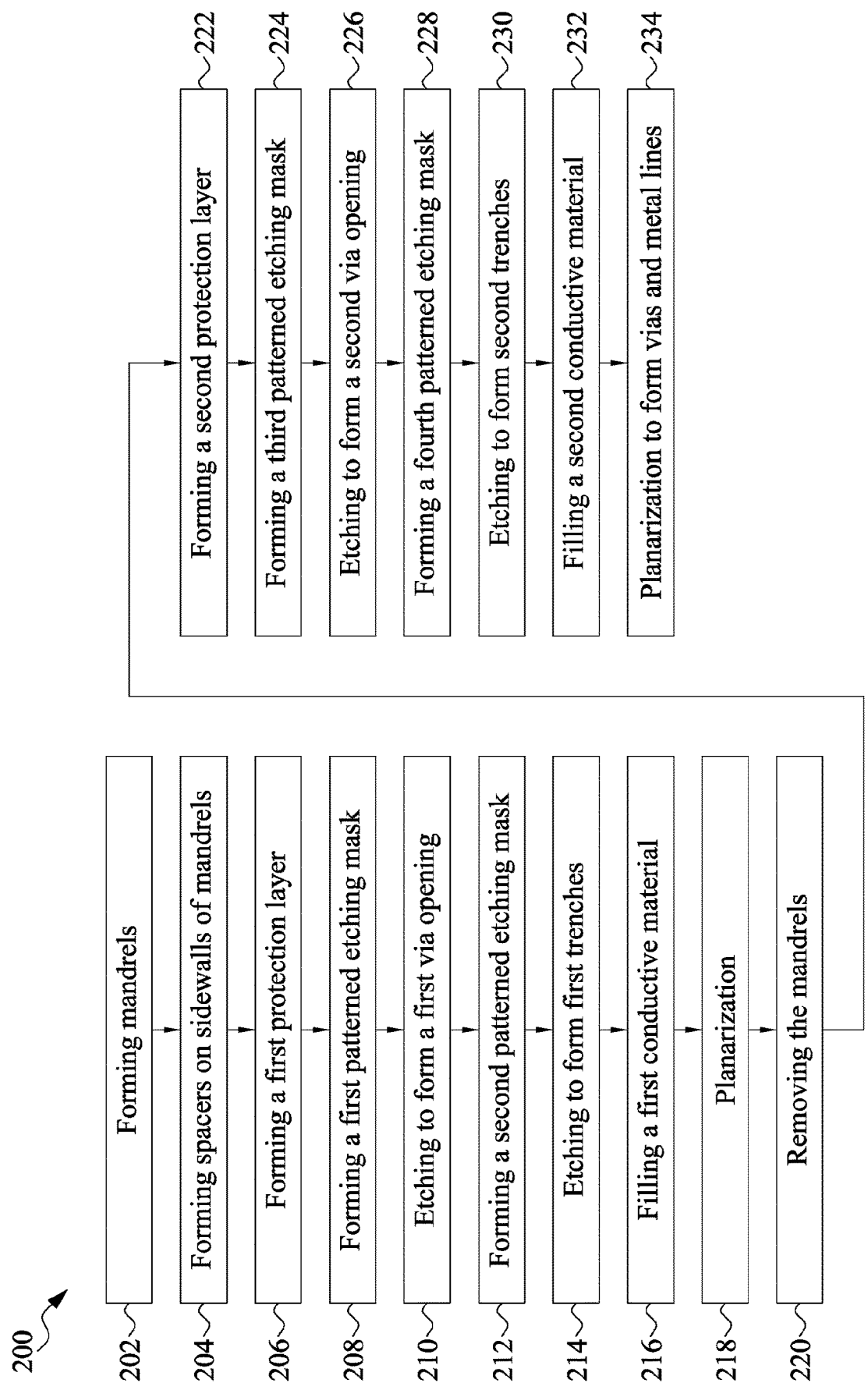
FIG. 21 illustrates a process flow for forming an interconnect structure in accordance with some embodiments.

FIG. 20 illustrates the formation of upper layers, which include etch stop layer 84, dielectric layer 86, vias 88, and metal lines 90. The formation process may be similar to the formation of vias 80A and 80B and metal lines 82A, 82B, 82C, 82D, and 82E, and the details of the formation processes are not repeated herein. The materials and the formation processes of etch stop layer 84, dielectric layer 86, vias 88, and metal lines 90 may be similar to the corresponding etch stop layer 24, dielectric layer 26, vias 80, and metal lines 82, respectively.

As shown in FIG. 20, vias 80A and 80B are formed in a double-patterning process. Accordingly, although vias 80A and 80B are closely located from each other, the patterns are not affected by optical proximity effect. Similarly, metal lines 82C and 82D (and metal lines 82A and 82B) are formed in another double-patterning process. Accordingly, although metal lines 82A and 82B are closely located from each other, and metal lines 82C and 82D are closely located from each other, the patterns are not affected by optical proximity effect. It is appreciated that the spacings between some of neighboring vias (and the spacing between neighboring metal lines) may be defined by the width W2 of spacers 32 (FIG. 2). Accordingly, very thin lines/vias may be formed.

The embodiments of the present disclosure have some advantageous features. The spacers formed on the sidewalls of mandrels are used as parts of etching masks in the defining of first vias and metal lines. Since the spacers may be formed with greater heights without requiring their lateral sizes to be increased, the spacers can be used as an effective etching mask in the process for defining the patterns of vias and metal lines. As a comparison, if an etching mask is formed through deposition and patterning (instead of using spacers), to make the line width of the etching mask to be small, the thickness of the etching mask needs to be reduced, which may cause the etching mask to be etched-through during the formation of via openings, hence the etching mask may lose their function as etching masks. Also, the spaces occupied by the mandrels may also be used for forming second vias and metal lines. The first and the second vias and the first and the second metal lines are effectively formed in a double-patterning process. Since the lateral sizes of the spacers may be formed small, the vias/metal lines formed by the double-patterning process may be close to each other and may have small lateral dimensions.

In accordance with some embodiments of the present disclosure, a method comprises forming a first mandrel and a second mandrel over a dielectric layer; forming a first spacer and a second spacer on the first mandrel and the second mandrel, respectively, wherein the first spacer and the second spacer are next to each other with a first space in between; etching the dielectric layer to form an opening in the dielectric layer, wherein the opening is overlapped by the first space, and wherein the first spacer and the second spacer are used as a part of an etching mask in the etching; filling a conductive material into the opening; and performing a planarization process on the conductive material. In an embodiment, the opening penetrates through the dielectric layer, with a conductive feature underlying the dielectric layer being exposed to the opening, and wherein a remaining portion of the conductive material filling the opening forms a conductive via extending into the dielectric layer. In an embodiment, the opening stops at an intermediate level between a top surface and a bottom surface of the dielectric layer, and wherein a remaining portion of the conductive material forms a conductive line in an upper part of the dielectric layer. In an embodiment, the forming the first spacer and the second spacer comprises: depositing a spacer layer on the first mandrel and the second mandrel; and performing an anisotropic etching process on the spacer layer, with remaining portions of the spacer layer forming the first spacer and the second spacer. In an embodiment, the method further comprises forming an additional etching mask on the first mandrel and the second mandrel and the first spacer and the second spacer, wherein the additional etching mask comprises an additional opening, with a part of the additional opening being directly over a part of the first spacer. In an embodiment, the method further comprises forming a third spacer on the first mandrel, wherein the first spacer and the third spacer are on opposing sides of the first mandrel, and wherein the method further comprises: removing the first mandrel to form a second space between the first spacer and the third spacer; etching the dielectric layer to form an additional opening in the dielectric layer and directly underlying the second space, wherein the first spacer and the third spacer are used as a part of an additional etching mask; and filling the additional opening with an additional conductive material. In an embodiment, the first spacer has a width, and a height greater than the width. In an embodiment, the planarization process is performed until the first spacer and the second spacer are removed. In an embodiment, the method further comprises forming a hard mask over the dielectric layer, with the first mandrel and the second mandrel and the first spacer and the second spacer being formed over the hard mask. In an embodiment, the method further comprises forming a protection layer covering a part of the first mandrel and the first spacer, wherein in the etching the dielectric layer to form the opening, the protection layer acts as an additional part of the etching mask.

In accordance with some embodiments of the present disclosure, a method comprises forming a mandrel over a dielectric layer; forming a first spacer on a sidewall of the mandrel, wherein the first spacer comprises a first sidewall and a second sidewall opposing to each other, wherein the second sidewall contacts the mandrel; etching a first portion of the dielectric layer to form a first opening in the dielectric layer, wherein the first opening has a third sidewall vertically aligned to the first sidewall; filling the first opening with a first conductive material; etching a second portion of the dielectric layer to form a second opening in the dielectric layer, wherein the second opening has a fourth sidewall vertically aligned to the second sidewall, and wherein the first opening and the second opening are on opposing sides of the mandrel; and filling the second opening with a second conductive material. In an embodiment, the method further comprises performing a planarization process to remove the first spacer, wherein a remaining portion of each of the first conductive material and the second conductive material forms a via or a metal line. In an embodiment, the method further comprises forming a second spacer neighboring the first spacer, with a space locating between the first spacer and the second spacer, and wherein the first opening is directly underlying the space. In an embodiment, the first opening has a fifth sidewall opposing the third sidewall, and wherein the fifth sidewall is vertically aligned to a sixth sidewall of the second spacer. In an embodiment, the method further comprises removing the mandrel, wherein the second portion of the dielectric layer is etched through a space left by the mandrel. In an embodiment, the forming the first spacer comprises: depositing a spacer layer on the mandrel; and performing an anisotropic etching process on the spacer layer, with a remaining portion of the spacer layer forming the first spacer.

In accordance with some embodiments of the present disclosure, a method comprises forming a hard mask over a low-k dielectric layer; forming a plurality of mandrels over the hard mask; forming a plurality of spacers on sidewalls of the plurality of mandrels, wherein a first space, a second space, and a third space separate neighboring ones of the plurality of spacers, with some portions of the hard mask exposed to the first space, the second space, and the third space; forming a protection layer filling into the first space; patterning the protection layer to remove the protection layer from the second space and the third space; forming a patterned etching mask over the protection layer; in a first etching process, etching-through a first portion of the hard mask and a first portion of the low-k dielectric layer directly underlying the second space to form a first opening in the low-k dielectric layer, wherein the protection layer and the patterned etching mask are in combination used as etching masks; and in a second etching process, etching-through a second portion of the hard mask and a second portion of the low-k dielectric layer directly underlying the third space to form a second opening in the low-k dielectric layer. In an embodiment, the method further comprises filling a first conductive material into the first opening. In an embodiment, the method further comprises filling a second conductive material into the second opening, wherein the first conductive material and the second conductive material are filled in separate filling processes. In an embodiment, the method further comprises performing a planarization process to remove portions of the first conductive material over the low-k dielectric layer, wherein in the planarization process, the plurality of mandrels, the plurality of spacers, and the hard mask are removed.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a first mandrel and a second mandrel over a dielectric layer;
    forming a first spacer and a second spacer on the first mandrel and the second mandrel, respectively, wherein the first spacer and the second spacer are next to each other with a first space in between;
    forming a protection layer covering a part of the first mandrel and the first spacer;
    forming a patterned etching mask over the protection layer, wherein the protection layer and the patterned etching mask are formed of different materials;
    etching the dielectric layer to form an opening in the dielectric layer, wherein in the etching, the first mandrel, the second mandrel, the protection layer, the first spacer, the second spacer, and the patterned etching mask collectively define patterns of the dielectric layer, wherein the opening is overlapped by the first space;
    filling a conductive material into the opening; and
    performing a planarization process on the conductive material.

2. The method of claim 1, wherein the opening penetrates through the dielectric layer, with a conductive feature underlying the dielectric layer being exposed to the opening, and wherein a remaining portion of the conductive material filling the opening forms a conductive via extending into the dielectric layer.

3. The method of claim 1, wherein the opening stops at an intermediate level between a top surface and a bottom surface of the dielectric layer, and wherein a remaining portion of the conductive material forms a conductive line in an upper part of the dielectric layer.

4. The method of claim 1, wherein the forming the first spacer and the second spacer comprises:
    depositing a spacer layer on the first mandrel and the second mandrel; and
    performing an anisotropic etching process on the spacer layer, with remaining portions of the spacer layer forming the first spacer and the second spacer.

5. The method of claim 1 further comprising forming an additional etching mask on the first mandrel and the second mandrel and the first spacer and the second spacer, wherein the additional etching mask comprises an additional opening, with a part of the additional opening being directly over a part of the first spacer.

6. The method of claim 1 further comprising forming a third spacer on the first mandrel, wherein the first spacer and the third spacer are on opposing sides of the first mandrel, and wherein the method further comprises:
    removing the first mandrel to form a second space between the first spacer and the third spacer;
    etching the dielectric layer to form an additional opening in the dielectric layer and directly underlying the second space, wherein the first spacer and the third spacer are used as a part of an additional etching mask; and
    filling the additional opening with an additional conductive material.

7. The method of claim 1, wherein the first spacer has a width, and a height greater than the width.

8. The method of claim 1, wherein the planarization process is performed until the first spacer and the second spacer are removed.

9. The method of claim 1 further comprising forming a hard mask over the dielectric layer, with the first mandrel and the second mandrel and the first spacer and the second spacer being formed over the hard mask.

10. The method of claim 1, wherein at a time after the opening is formed, both of a top surface of the protection layer and a second top surface of the patterned etching mask are exposed.

11. A method comprising:
    forming a mandrel over a dielectric layer;
    forming a first spacer on a sidewall of the mandrel, wherein the first spacer comprises a first sidewall and a second sidewall opposing to each other, wherein the second sidewall contacts the mandrel;
    etching a first portion of the dielectric layer to form a first opening in the dielectric layer, wherein the first opening has a third sidewall vertically aligned to the first sidewall;
    filling the first opening with a first conductive material;
    forming a protection layer on the first conductive material;
    forming an etching mask over the protection layer;
    etching a second portion of the dielectric layer to form a second opening in the dielectric layer, wherein the protection layer and the etching mask collectively define parts of patterns of the dielectric layer, wherein the second opening has a fourth sidewall vertically aligned to the second sidewall; and
    filling the second opening with a second conductive material.

12. The method of claim 11 further comprising performing a planarization process to remove the first spacer, wherein a remaining portion of each of the first conductive material and the second conductive material forms a via or a metal line.

13. The method of claim 11 further comprising forming a second spacer neighboring the first spacer, with a space locating between the first spacer and the second spacer, and wherein the first opening is directly underlying the space.

14. The method of claim 13, wherein the first opening has a fifth sidewall opposing the third sidewall, and wherein the fifth sidewall is vertically aligned to a sixth sidewall of the second spacer.

15. The method of claim 11 further comprising removing the mandrel, wherein the second portion of the dielectric layer is etched through a space left by the mandrel.

16. The method of claim 11, wherein the forming the first spacer comprises:
depositing a spacer layer on the mandrel; and
performing an anisotropic etching process on the spacer layer, with a remaining portion of the spacer layer forming the first spacer.

17. A method comprising:
forming a hard mask over a low-k dielectric layer;
forming a plurality of mandrels over the hard mask;
forming a plurality of spacers on sidewalls of the plurality of mandrels, wherein a first space, a second space, and a third space separate neighboring ones of the plurality of spacers, with some portions of the hard mask exposed to the first space, the second space, and the third space;
forming a protection layer filling into the first space;
patterning the protection layer to remove the protection layer from the second space and the third space;
forming a patterned etching mask over the protection layer;
in a first etching process, etching-through a first portion of the hard mask and a first portion of the low-k dielectric layer directly underlying the second space to form a first opening in the low-k dielectric layer, wherein the protection layer and the patterned etching mask are in combination used as etching masks; and
in a second etching process, etching-through a second portion of the hard mask and a second portion of the low-k dielectric layer directly underlying the third space to form a second opening in the low-k dielectric layer.

18. The method of claim 17 further comprising filling a first conductive material into the first opening.

19. The method of claim 18 further comprising filling a second conductive material into the second opening, wherein the first conductive material and the second conductive material are filled in separate filling processes.

20. The method of claim 18 further comprising performing a planarization process to remove portions of the first conductive material over the low-k dielectric layer, wherein in the planarization process, the plurality of mandrels, the plurality of spacers, and the hard mask are removed.

* * * * *